United States Patent
Wang et al.

(10) Patent No.: US 9,547,231 B2
(45) Date of Patent: Jan. 17, 2017

(54) DEVICE AND METHOD FOR MAKING PHOTOMASK ASSEMBLY AND PHOTODETECTOR DEVICE HAVING LIGHT-COLLECTING OPTICAL MICROSTRUCTURE

(71) Applicant: Avago Technologies General IP (Singapore) Pte. Ltd., Singapore (SG)

(72) Inventors: Tak Kui Wang, San Jose, CA (US); Laura M. Giovane, Sunnyvale, CA (US); Ramana M. V. Murty, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/229,859

(22) Filed: Mar. 29, 2014

(65) Prior Publication Data
US 2016/0170296 A1    Jun. 16, 2016

Related U.S. Application Data

(63) Continuation-in-part of application No. 13/915,849, filed on Jun. 12, 2013.

(51) Int. Cl.
*H01L 31/0232* (2014.01)
*G03F 1/50* (2012.01)
(Continued)

(52) U.S. Cl.
CPC . *G03F 1/50* (2013.01); *G03F 1/76* (2013.01); *G03F 1/80* (2013.01); *H01L 31/02327* (2013.01)

(58) Field of Classification Search
CPC ............. H01L 31/02327; H01L 33/486; H01L 27/14632; H01S 5/18302; G02B 13/0085; G02B 3/0062
(Continued)

(56) References Cited

U.S. PATENT DOCUMENTS 4,130,361 A * 12/1978 Humphrey ......... G01M 11/0228
356/125
5,045,908 A    9/1991 Lebby
(Continued)

FOREIGN PATENT DOCUMENTS

DE    19730329 A1    1/1999

OTHER PUBLICATIONS

Kim, Yun Ho, et al. "Optically Selective Microlens Photomasks Using Self-Assembled Smectic Liquid Crystal Defect Arrays". Advanced Materials, vol. 22, pp. 2416-2420, Apr. 7, 2010 [online] [retrieved on Nov. 20, 2013]. Retrieved from the Internet: <URL: http://http://jbyoon0901.cafe24.com/wp-content/uploads/2013/05/AM_2010_Optically-selective-microlens-photomasks-using-self-assembled-smecticliquid-crystal-defect-arrays.pdf>.
(Continued)

*Primary Examiner* — William F Kraig
*Assistant Examiner* — Maliheh Malek

(57) ABSTRACT

An optical mask can be made by providing a transparent mask substrate; depositing a first layer of opaque material, forming an aperture in the first layer; depositing a second layer of transparent material, depositing a third layer of transparent material; patterning the third layer to produce a disc-shaped region, heating the third layer until the disc-shaped region reflows into a lens-shaped region and crosslinks, depositing a fourth layer, patterning the fourth layer to produce a cavity extending to the surface of the lens-shaped region, and dry etching the end of the cavity until the second layer develops a shape corresponding to the lens-shaped region.

22 Claims, 43 Drawing Sheets

(51) Int. Cl.
*G03F 1/76* (2012.01)
*G03F 1/80* (2012.01)
*H01L 33/48* (2010.01)
*H01L 27/146* (2006.01)
*G02B 3/00* (2006.01)

(58) Field of Classification Search
USPC .......................................... 257/98; 438/27
See application file for complete search history.

(56) References Cited

U.S. PATENT DOCUMENTS

| | | | | |
|---|---|---|---|---|
| 5,170,448 | A * | 12/1992 | Ackley et al. .................. | 385/31 |
| 5,455,144 | A * | 10/1995 | Okamoto ................... | G03F 1/14 |
| | | | | 257/E21.645 |
| 5,710,667 | A * | 1/1998 | Goto .................... | G02B 5/1876 |
| | | | | 250/208.1 |
| 5,771,085 | A * | 6/1998 | Ochi et al. ..................... | 349/158 |
| 5,777,747 | A * | 7/1998 | Tanaka ......................... | 356/401 |
| 5,881,165 | A * | 3/1999 | Tanaka ......................... | 382/151 |
| 5,923,990 | A * | 7/1999 | Miura .......................... | 438/401 |
| 5,958,631 | A * | 9/1999 | Acosta ..................... | G03F 1/22 |
| | | | | 378/34 |
| 5,973,785 | A * | 10/1999 | Okamoto ........... | G01B 11/0608 |
| | | | | 356/401 |
| 5,991,031 | A * | 11/1999 | Higashi ................ | G01N 21/276 |
| | | | | 356/306 |
| 6,040,591 | A * | 3/2000 | Otsuka ................ | H01L 27/1462 |
| | | | | 257/232 |
| 6,072,915 | A * | 6/2000 | Tanaka ......................... | 382/287 |
| 6,258,491 | B1 * | 7/2001 | Maldonado ............... | G03F 1/22 |
| | | | | 430/5 |
| 6,269,322 | B1 * | 7/2001 | Templeton et al. ........... | 702/150 |
| 6,583,438 | B1 * | 6/2003 | Uchida ................ | G02B 3/0012 |
| | | | | 257/291 |
| 6,624,404 | B2 * | 9/2003 | Lee ................... | H01L 31/02161 |
| | | | | 250/208.1 |
| 6,630,289 | B1 * | 10/2003 | Kwok et al. .................. | 430/321 |
| 7,166,489 | B2 * | 1/2007 | Kim ................. | H01L 27/14621 |
| | | | | 438/59 |
| 7,535,949 | B2 | 5/2009 | Wang et al. | |
| 7,897,942 | B1 * | 3/2011 | Bareket .................. | G03B 27/62 |
| | | | | 250/398 |
| 8,013,927 | B2 * | 9/2011 | Takagi ................. | G02B 3/0018 |
| | | | | 257/432 |
| 8,284,293 | B2 * | 10/2012 | Del Monte ....... | H01L 27/14627 |
| | | | | 348/335 |
| 8,384,097 | B2 * | 2/2013 | Yan ................................ | 257/88 |
| 8,507,300 | B2 * | 8/2013 | Dong ............................. | 438/29 |
| 8,530,814 | B2 * | 9/2013 | Wano ............... | H01L 27/14627 |
| | | | | 250/208.1 |
| 8,890,221 | B2 * | 11/2014 | Lenchenkov ..... | H01L 27/14629 |
| | | | | 257/294 |
| 2002/0030800 | A1 * | 3/2002 | Nellissen ................... | G03F 1/14 |
| | | | | 355/53 |
| 2002/0102055 | A1 * | 8/2002 | Zweiback .......... | G02B 6/02138 |
| | | | | 385/37 |
| 2002/0163006 | A1 * | 11/2002 | Yoganandan et al. .......... | 257/81 |
| 2003/0112523 | A1 * | 6/2003 | Daniell ......................... | 359/626 |
| 2003/0141455 | A1 * | 7/2003 | Lambert et al. .............. | 250/353 |
| 2005/0061950 | A1 * | 3/2005 | Jiang et al. ................ | 250/208.1 |
| 2005/0078377 | A1 * | 4/2005 | Li ..................... | B29D 11/00278 |
| | | | | 359/619 |
| 2005/0093116 | A1 * | 5/2005 | Palmteer et al. ............. | 257/676 |
| 2005/0179103 | A1 * | 8/2005 | Nakai ................ | H01L 27/14627 |
| | | | | 257/436 |
| 2005/0218801 | A1 * | 10/2005 | Hon et al. ...................... | 313/512 |
| 2005/0274968 | A1 * | 12/2005 | Kuo .................. | H01L 27/14621 |
| | | | | 257/98 |
| 2006/0039655 | A1 * | 2/2006 | Wilson ..................... | G02B 6/32 |
| | | | | 385/79 |
| 2006/0054782 | A1 * | 3/2006 | Olsen ................... | G02B 3/0062 |
| | | | | 250/208.1 |
| 2006/0141653 | A1 * | 6/2006 | Choi ................. | H01L 27/14621 |
| | | | | 438/48 |
| 2007/0009816 | A1 * | 1/2007 | Pforr et al. ..................... | 430/30 |
| 2007/0029277 | A1 * | 2/2007 | Jacobowitz et al. ........... | 216/24 |
| 2007/0058904 | A1 * | 3/2007 | Ban et al. ........................ | 385/52 |
| 2007/0194336 | A1 * | 8/2007 | Shin et al. ...................... | 257/98 |
| 2007/0241357 | A1 * | 10/2007 | Yan ................................ | 257/98 |
| 2008/0087921 | A1 * | 4/2008 | Yu et al. .......... | H01L 27/14627 |
| | | | | 257/213 |
| 2008/0191022 | A1 | 8/2008 | Barkan et al. | |
| 2009/0020839 | A1 * | 1/2009 | Furuyama .................... | 257/432 |
| 2009/0161106 | A1 * | 6/2009 | Shin et al. ..................... | 356/399 |
| 2009/0174947 | A1 * | 7/2009 | Hasegawa .................... | 359/642 |
| 2010/0157428 | A1 * | 6/2010 | Wu et al. ...................... | 359/622 |
| 2010/0165134 | A1 * | 7/2010 | Dowski et al. ............. | 348/218.1 |
| 2010/0278480 | A1 * | 11/2010 | Vasylyev ................... | G02B 3/005 |
| | | | | 385/33 |
| 2010/0284077 | A1 * | 11/2010 | Shyu .................... | G02B 13/001 |
| | | | | 359/503 |
| 2010/0301500 | A1 * | 12/2010 | Louh .............................. | 264/1.1 |
| 2011/0179631 | A1 * | 7/2011 | Gates ................ | G02B 27/2292 |
| | | | | 29/592 |
| 2011/0194186 | A1 * | 8/2011 | Mak ................. | B29D 11/00298 |
| | | | | 359/641 |
| 2012/0043634 | A1 * | 2/2012 | Kurihara ...................... | 257/432 |
| 2012/0063131 | A1 * | 3/2012 | Jamar ................ | B29C 67/0066 |
| | | | | 362/235 |
| 2012/0076454 | A1 * | 3/2012 | Shiraishi ................... | G02B 6/42 |
| | | | | 385/14 |
| 2012/0140044 | A1 * | 6/2012 | Galstian ............. | A61B 1/00193 |
| | | | | 348/47 |
| 2012/0183288 | A1 * | 7/2012 | Kishinami et al. ........... | 396/505 |
| 2012/0206916 | A1 * | 8/2012 | Ohta ..................... | G02B 3/0056 |
| | | | | 362/238 |
| 2012/0218455 | A1 * | 8/2012 | Imai ..................... | G02B 13/001 |
| | | | | 348/340 |
| 2012/0243091 | A1 * | 9/2012 | Amm ..................... | G06F 1/1605 |
| | | | | 359/489.07 |
| 2012/0292535 | A1 * | 11/2012 | Choi et al. ................ | 250/492.22 |
| 2013/0170043 | A1 | 7/2013 | Ko | |
| 2013/0183627 | A1 * | 7/2013 | Shibazaki ..................... | 430/325 |
| 2013/0271826 | A1 * | 10/2013 | Widmer ....................... | 359/355 |
| 2014/0022634 | A1 * | 1/2014 | Takahashi .................... | 359/463 |
| 2014/0049846 | A1 * | 2/2014 | Wang ........................... | 359/793 |
| 2014/0178634 | A1 * | 6/2014 | Sugishima ........ | H01L 27/14621 |
| | | | | 428/138 |
| 2014/0198399 | A1 * | 7/2014 | Lu et al. ....................... | 359/784 |
| 2014/0253678 | A1 * | 9/2014 | Tocher ................... | G03B 37/04 |
| | | | | 348/36 |
| 2014/0347741 | A1 * | 11/2014 | Karam et al. ................. | 359/665 |
| 2015/0042704 | A1 * | 2/2015 | Smith et al. ................... | 345/697 |
| 2016/0069997 | A1 * | 3/2016 | Johnson ................. | G01S 17/06 |
| | | | | 356/614 |
| 2016/0219269 | A1 * | 7/2016 | Tekolste ................ | G06T 19/006 |

OTHER PUBLICATIONS

On Chip Color Filters. Product information [online]. Toppan Photomasks Inc., 2013 [retrieved on Nov. 20, 2013]. Retrieved from the Internet: <URL:http://www.photomask.com/products/on-chip-color-filters>.
Bardinal, et al., "Collective Micro-Optics Technologies for VCSEL Photonic Integration," Advances in Optical Technologies, 2011.
Ogura, et al., "Optical manipulation of microscopic objects by means of vertical-cavity surface-emitting laser array sources," Applied Optics, vol. 40, No. 30, Oct. 20, 2001.
Dahlgren, et al., "Aspheric nonimaging concentrators for multimode fiber coupling," Proc. of SPIE, vol. 7221, 2009.
"On Chip Color Filters", Product Information [online]. Toppan Photomasks, Inc. 2013 [retrieved on Nov. 20, 2013]. Retrieved from the internet: <URL:http://www.photomask.com/products/on-chip-color-filters>.
Kim, et al., "Optically Selective Microlens Photomasks Using Self-Assembled Smectic Liquid Crystal Defect Arrays", Advanced Materials, vol. 22, pp. 2416-2420, Apr. 7, 2020 [online] [retrieved

(56) References Cited

OTHER PUBLICATIONS on Nov. 20, 2013]. Retrieved from the Internet: <URL: http://http://jbyoon0901.cafe24.com/wp-content/uploads/2013/05/AM_2010_Optically-selective-microlens-photomasks-using-self-a.

\* cited by examiner

DEVICE AND METHOD FOR MAKING PHOTOMASK ASSEMBLY AND PHOTODETECTOR DEVICE HAVING LIGHT-COLLECTING OPTICAL MICROSTRUCTURE

CROSS-REFERENCE TO RELATED APPLICATION

This is a Continuation-in-Part of U.S. patent application Ser. No. 13/915,849, filed Jun. 12, 2013, entitled "PHOTODETECTOR DEVICE HAVING LIGHT-COLLECTING OPTICAL MICROSTRUCTURE," the benefit of the filing date of which is hereby claimed, and the specification of which is hereby incorporated herein in its entirety by this reference.

BACKGROUND

Optical data communication systems commonly include optical receiver devices that receive optical signals conveyed via an optical communication link (e.g., optical fiber) and convert the optical signals into electrical signals. In this manner, the data or information contained in the optical signals can be recovered or received and provided to other electronic systems, such as switching systems or processing systems. Such optical receiver devices include photodetectors, such as photodiodes. A common type of photodiode used in optical receiver devices is known as a PIN photodiode due to its structure comprising an intrinsic or lightly doped semiconductor layer sandwiched between a P-type semiconductor layer and an N-type semiconductor layer. PIN diode physics dictate that the size of the active area (i.e., photosensitive area) is inversely proportional to the maximum data rate that the device can detect. Thus, a PIN photodiode suitable for high data rates must have a small active area. However, the light emitted by an optical fiber forms a beam that is relatively wide compared with the width of a high-speed PIN photodiode. Focusing or otherwise directing the incoming light (optical signals) onto a very small PIN photodiode poses design challenges.

An optical receiver can include a lens between a PIN photodiode device and an end of an optical fiber to focus light emitted from the fiber onto the PIN photodiode. However, including such a lens in an optical receiver can impact ease of assembly and thus manufacturing economy. It has also been suggested to fashion a region of the semiconductor substrate from which the PIN photodiode is formed into a reflector that directs light into the active area of a PIN photodiode from a lateral direction, i.e., parallel to the plane of the substrate. However, such a structure is difficult to fabricate and thus impacts manufacturing economy. Moreover, such a structure is generally incapable of increasing the light-collecting area of the PIN photodiode device by more than a few microns.

It would be desirable to provide a photodetector device that has a large collection area relative to the size of the active area and that can be readily manufactured.

SUMMARY

Embodiments of the present invention relate to optical mask devices and methods for using optical mask devices.

In an exemplary embodiment, an optical mask device comprises an optical mask substrate transparent to a predetermined wavelength of light, a first layer on a surface of the optical mask substrate, and a second layer on a surface of the first layer. The first layer consists of a material opaque to the predetermined wavelength and has an aperture. The second layer covers the aperture and consists of a material transparent to the predetermined wavelength. A refractive lens is formed in the second layer and aligned with the aperture.

In an exemplary embodiment, an optical mask device includes an optical mask substrate and a layered structure formed on the optical mask substrate. The layered structure includes a mask alignment indicator and a layer defining a lens. The layer defining the lens is located between the optical mask substrate and the mask alignment indicator. The lens, which can be refractive or diffractive, is aligned with the mask alignment indicator.

In an exemplary embodiment, a method includes: providing an optical mask substrate that is transparent to a predetermined wavelength of light; depositing a first layer consisting of a material opaque to the predetermined wavelength on a surface of the optical mask substrate; forming an aperture in the first layer; depositing a second layer consisting of a material transparent to the predetermined wavelength on a surface of the first layer; depositing a third layer consisting of photoresist material on a surface of the second layer; patterning the third layer to produce a disc-shaped region; heating the third layer until the disc-shaped region reflows into a lens-shaped region and cross-links; depositing a fourth layer consisting of photoresist material on a surface of the third layer; patterning the fourth layer to produce a cavity extending to the surface of the lens-shaped region, wherein the end of the cavity includes the surface of the lens-shaped region; and dry etching the end of the cavity until the second layer develops a shape corresponding to the lens-shaped region. The first and second layers and the optical mask substrate together define an optical mask device that can be used to photolithographically produce opto-electronic devices.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
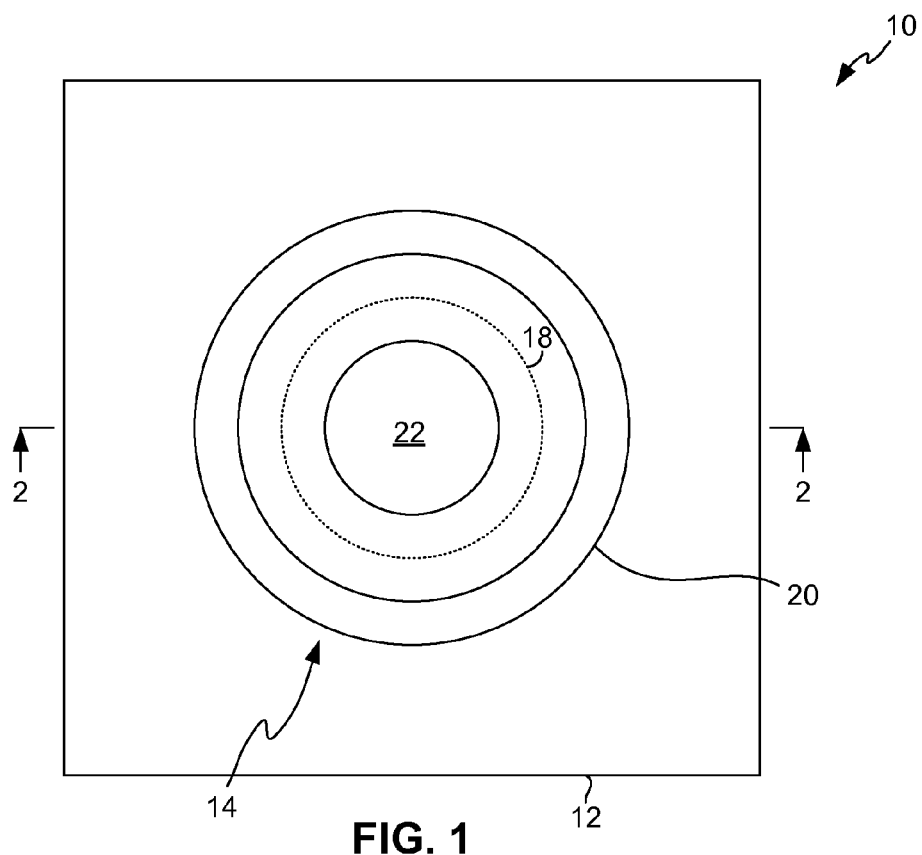
FIG. 1 is a top plan view of an opto-electronic device, in accordance with a first exemplary embodiment of the invention.
Figure 2:
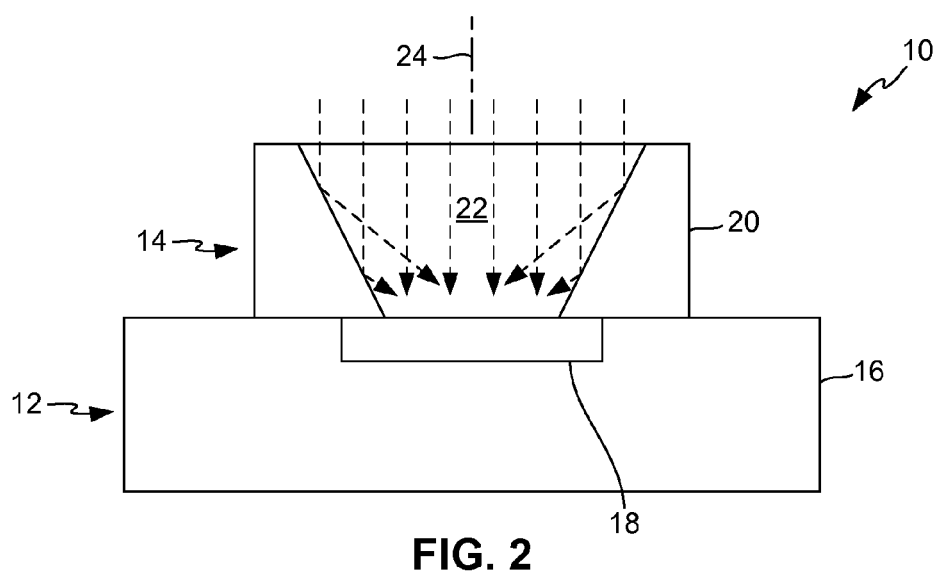
FIG. 2 is a sectional view taken along line 2-2 of FIG. 1.

As illustrated in FIGS. 1-2, in a first illustrative or exemplary embodiment of the invention, an opto-electronic device 10 includes a semiconductor device 12 and a non-imaging optical concentrator 14 mounted on the surface of semiconductor device 12. Semiconductor device 12 includes a substrate 16 and a photodetector having an active area 18 formed on the surface of substrate 16.

Non-imaging optical concentrator 14 has a barrel-shaped body 20 with an interior cavity region 22. Cavity region 22 has a frusto-conical or truncated cone shape. That is, cavity region 22 has a circular cross-sectional shape that tapers in diameter (and thus tapers in area) from one end to the other. Cavity region 22 has the largest diameter (i.e., is widest) at the end farthest from active area 18 and has the smallest diameter (i.e., is narrowest) at the end adjacent to active area 18. The longitudinal axis 24 of cavity region 22 is aligned with the optical axis (central region) of active area 18. Cavity region 22 defines a peripheral surface, i.e., a surface that extends around the periphery of the central region of active area 18. The walls of cavity region 22 are coated with a metal film or other layer of optically reflective material. As described below in further detail, non-imaging optical concentrator 14 can be made of a semiconductor material, a photosensitive polymer, or other suitable material.

In operation, light is received at the wide end of cavity region 22. The walls of cavity region 22 (i.e., the peripheral surface) redirect a portion of this incoming light into active area 18 by reflecting the light, as indicated in broken line in FIG. 2.

Figure 3:
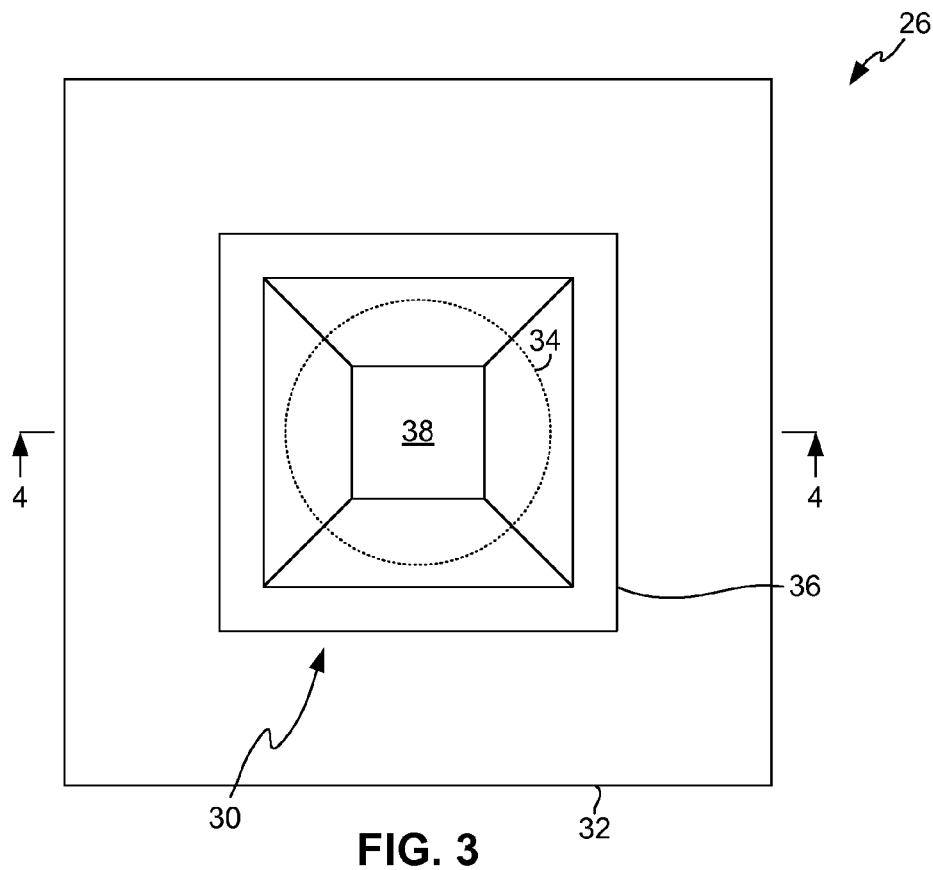
FIG. 3 is a top plan view of another opto-electronic device, in accordance with a second exemplary embodiment of the invention.
Figure 4:
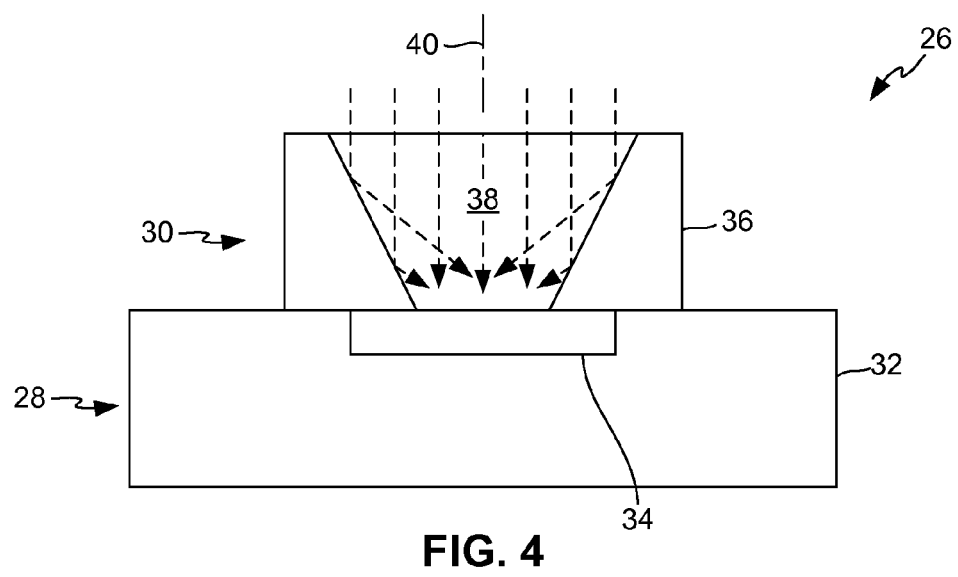
FIG. 4 is a sectional view taken along line 4-4 of FIG. 3.

As illustrated in FIGS. 3-4, in a second illustrative or exemplary embodiment of the invention, an opto-electronic device 26 includes a semiconductor device 28 and a non-imaging optical concentrator 30 mounted on the surface of semiconductor device 28. Semiconductor device 28 includes a substrate 32 and a photodetector having an active area 34 formed on the surface of substrate 32.

Non-imaging optical concentrator 30 has a body 36 with a square profile and an interior cavity region 38. Cavity region 38 has a frusto-polyhedral (more specifically, frusto-pyramidal or truncated four-sided pyramidal) shape. That is, cavity region 38 has a polygonal (more specifically, square) cross-sectional shape that tapers in size from one end to the other. Cavity region 38 has the largest cross-section (i.e., each side is longest) at the end farthest from active area 34 and has the smallest cross-section (i.e., each side is shortest) at the end adjacent to active area 34. The longitudinal axis 40 of cavity region 38 is aligned with the optical axis of active area 34. Cavity region 38 defines a peripheral surface, i.e., a surface that extends around the periphery of a central region of active area 34. The walls of cavity region 38 are coated with a metal film or other layer of optically reflective material. As described below in further detail, non-imaging optical concentrator 30 can be made of a semiconductor material, a photosensitive polymer, or other suitable material.

In operation, light is received at the wide end of cavity region 38. The walls of cavity region 38 (i.e., the peripheral surface) redirect a portion of this incoming light into active area 34 by reflecting the light, as indicated in broken line in FIG. 4.

Figure 5:
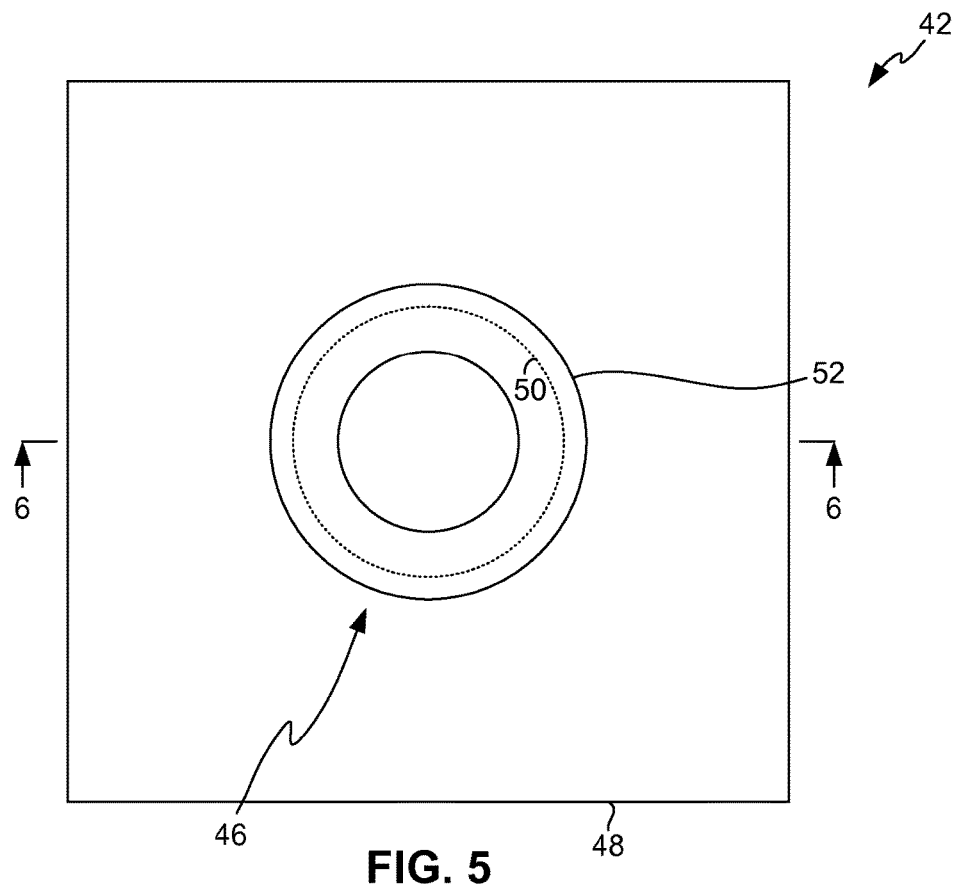
FIG. 5 is a top plan view of yet another opto-electronic device, in accordance with a third exemplary embodiment of the invention.
Figure 6:
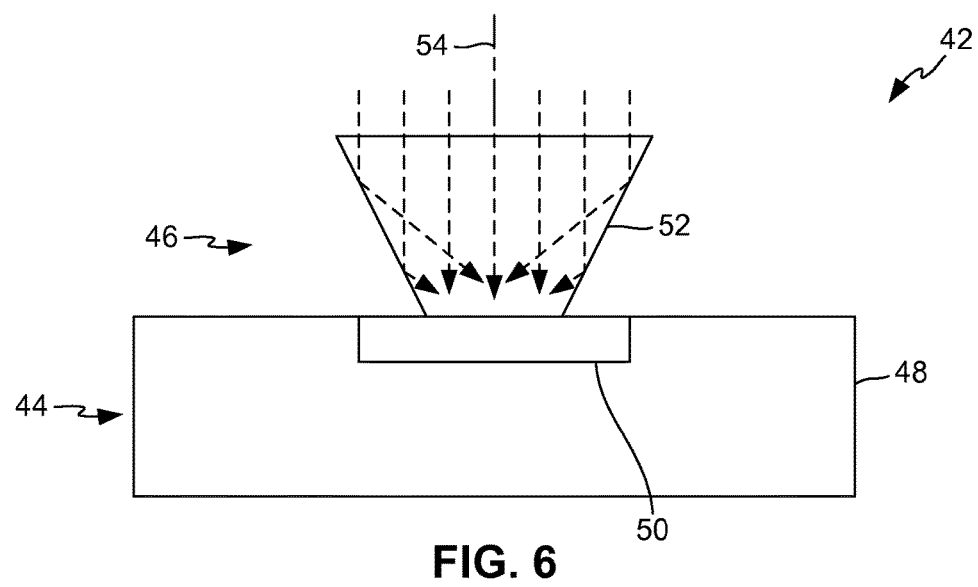
FIG. 6 is a sectional view taken along line 6-6 of FIG. 5.

As illustrated in FIGS. 5-6, in a third illustrative or exemplary embodiment of the invention, an opto-electronic device 42 includes a semiconductor device 44 and a non-imaging optical concentrator 46 mounted on the surface of semiconductor device 12. Semiconductor device 44 includes a substrate 48 and a photodetector having an active area 50 formed on the surface of substrate 48.

Non-imaging optical concentrator 46 has a solid region 52. Solid region 52 has a frusto-conical or truncated cone shape. That is, solid region 52 has a circular cross-sectional shape that tapers in diameter (and thus tapers in area) from one end to the other. Solid region 52 has the largest diameter (i.e., is widest) at the end farthest from active area 50 and has the smallest diameter (i.e., is narrowest) at the end adjacent to active area 50. The longitudinal axis 54 of solid region 52 is aligned with the optical axis of active area 50. Solid region 52 defines a peripheral surface, i.e., a surface that extends around the periphery of a central region of active area 50. The peripheral surface is reflective (i.e., total internal reflection (TIR) occurs) because it is the interface between the sidewalls of solid region 52 and the surrounding air. As described below in further detail, non-imaging optical concentrator 46 can be made of an optically transparent photosensitive polymer or other suitable material.

In operation, light is received at the wide end of solid region 52. The peripheral surface defined by the interface between the sidewalls of solid region 52 and the surrounding air redirects a portion of this incoming light into active area 50 by reflecting the light, as indicated in broken line in FIG. 6.

Figure 7:
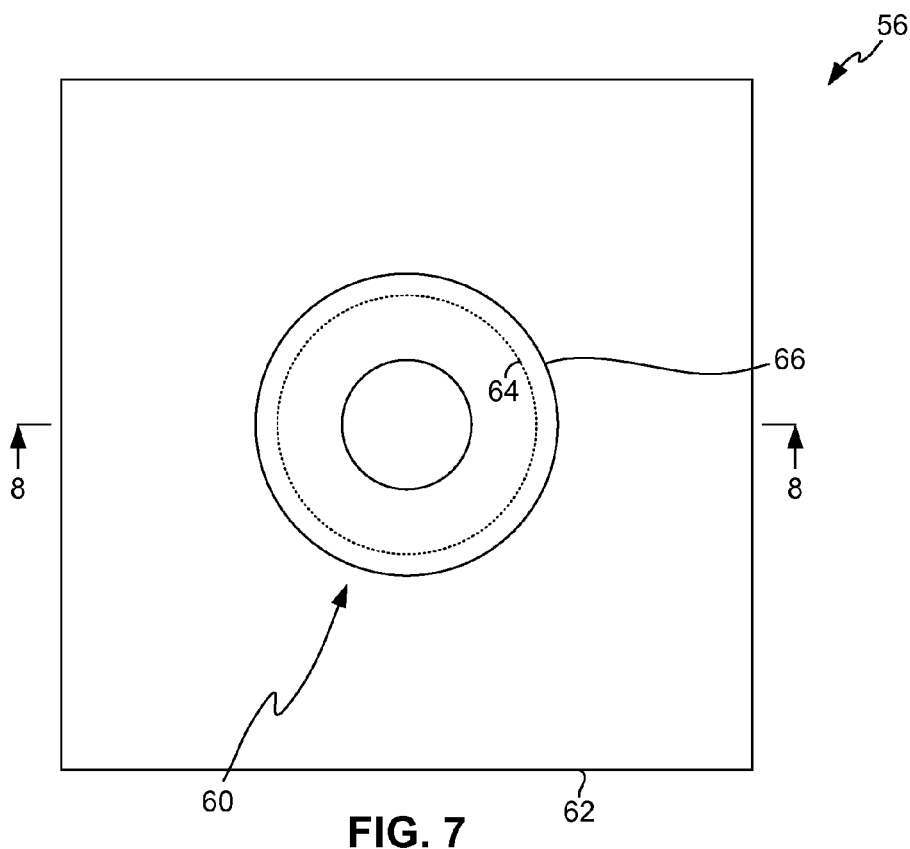
FIG. 7 is a top plan view of still another opto-electronic device, in accordance with a fourth exemplary embodiment of the invention.
Figure 8:
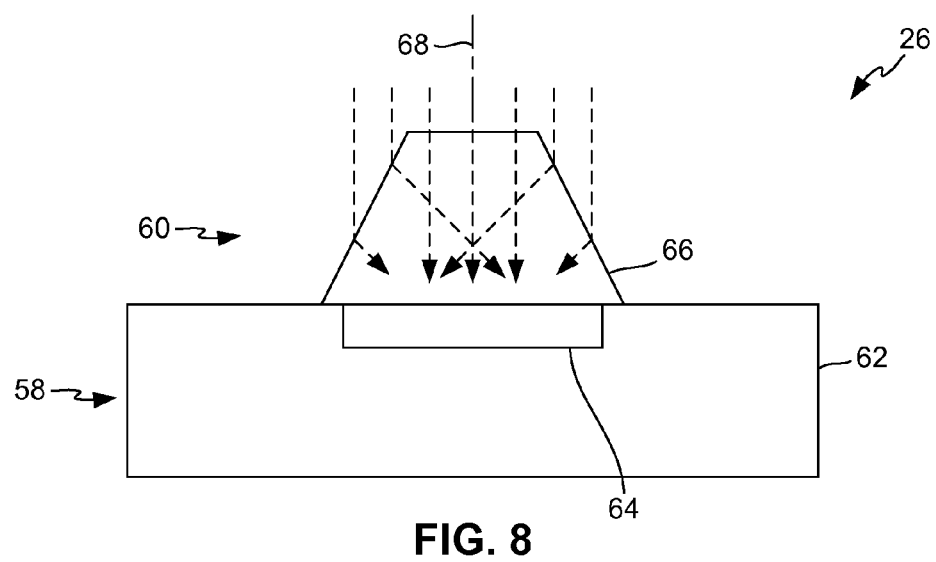
FIG. 8 is a sectional view taken along line 8-8 of FIG. 7.

As illustrated in FIGS. 7-8, in a fourth illustrative or exemplary embodiment of the invention, an opto-electronic device 56 includes a semiconductor device 58 and a non-imaging optical concentrator 60 mounted on the surface of semiconductor device 58. Semiconductor device 58 includes a substrate 62 and a photodetector having an active area 64 formed on the surface of substrate 62.

Non-imaging optical concentrator 60 has a solid region 66. Solid region 66 has a frusto-conical or truncated cone shape. That is, solid region 66 has a circular cross-sectional shape that tapers in diameter (and thus tapers in area) from one end to the other. Solid region 66 has the largest diameter (i.e., is widest) at the end adjacent to active area 64 and has the smallest diameter (i.e., is narrowest) at the end farthest from active area 64. The longitudinal axis 68 of solid region 66 is aligned with the optical axis of active area 64. Solid region 66 defines a peripheral surface, i.e., a surface that extends around the periphery of a central region of active area 64. The peripheral surface is refractive because it is the interface between the sidewalls of solid region 66 and the surrounding air. As described below in further detail, non-imaging optical concentrator 60 can be made of a semiconductor material, a photosensitive polymer, or other suitable material.

In operation, light is received through the sidewalls and the narrow end of solid region 66. The peripheral surface defined by the interface between the sidewalls of solid region 66 and the surrounding air redirects a portion of this incoming light into active area 64 by refracting the light, as indicated in broken line in FIG. 8.

Figure 9:
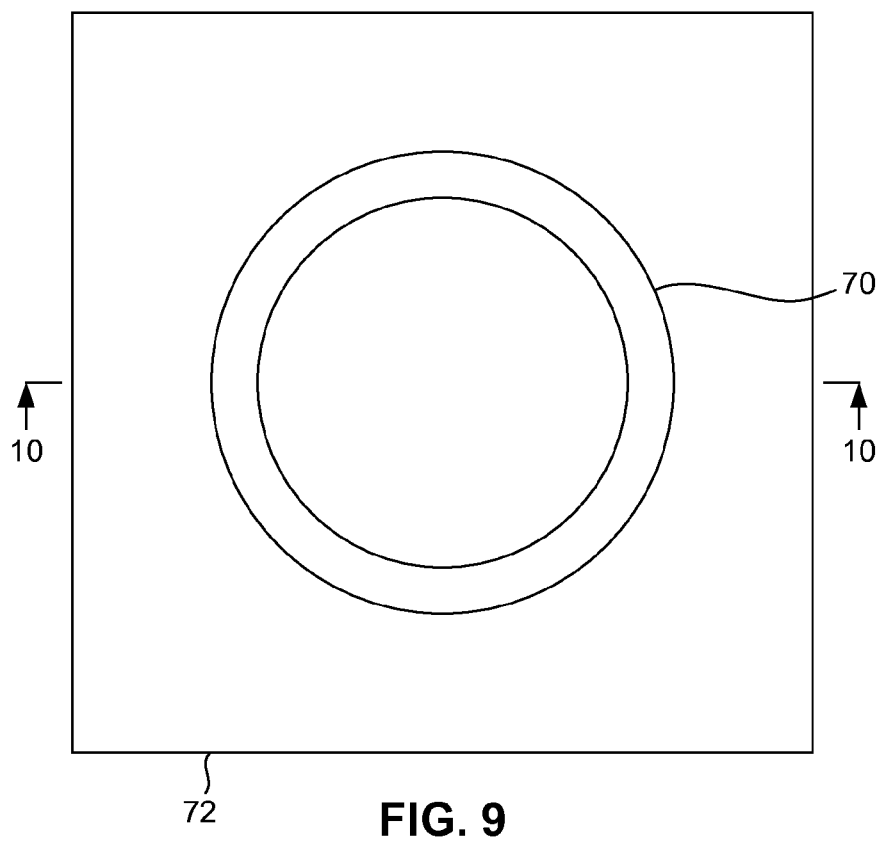
FIG. 9 is a top plan view illustrating a first step of an exemplary method for making the exemplary opto-electronic device of FIGS. 1-2.
Figure 10:
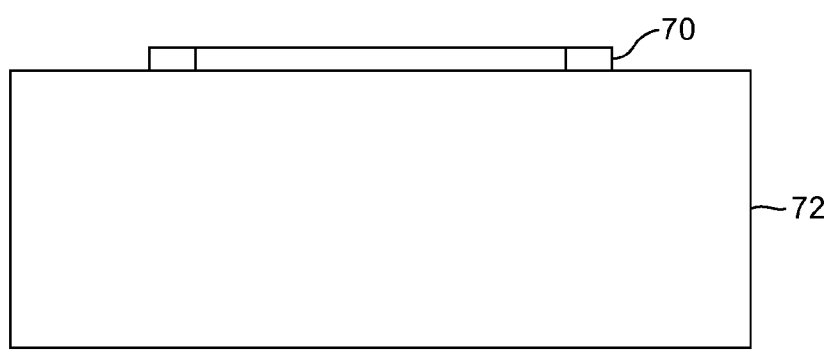
FIG. 10 is a sectional view taken along line 10-10 of FIG. 9.
Figure 11:
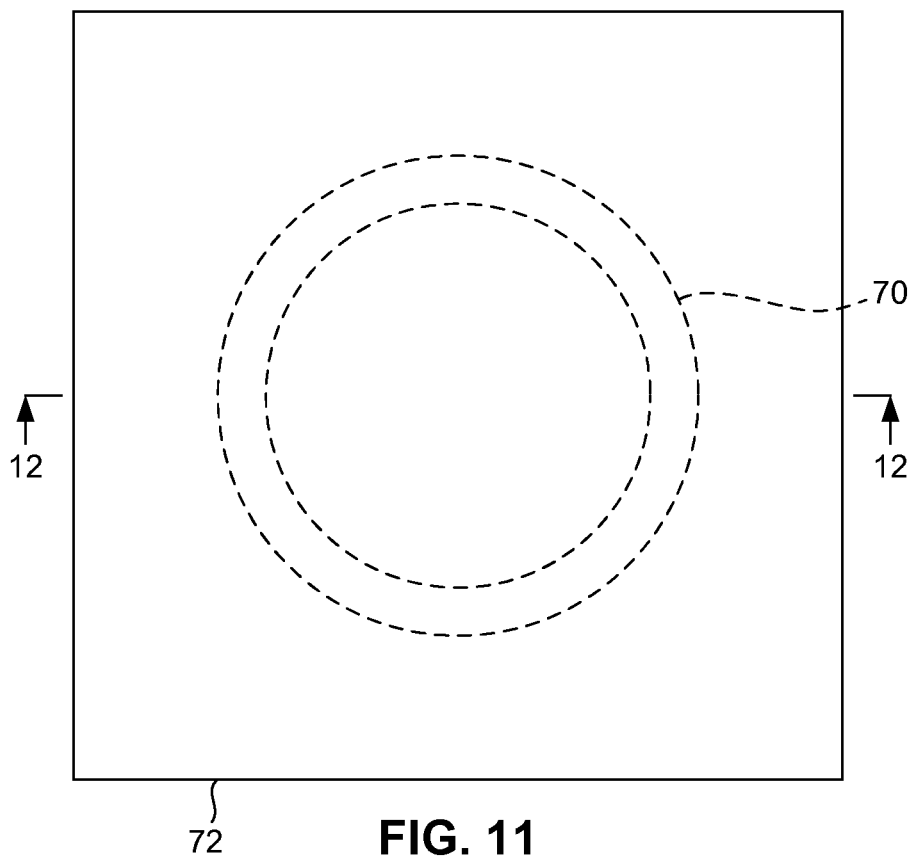
FIG. 11 is a top plan view illustrating a second step of an exemplary method for making the exemplary opto-electronic device of FIGS. 1-2.
Figure 12:
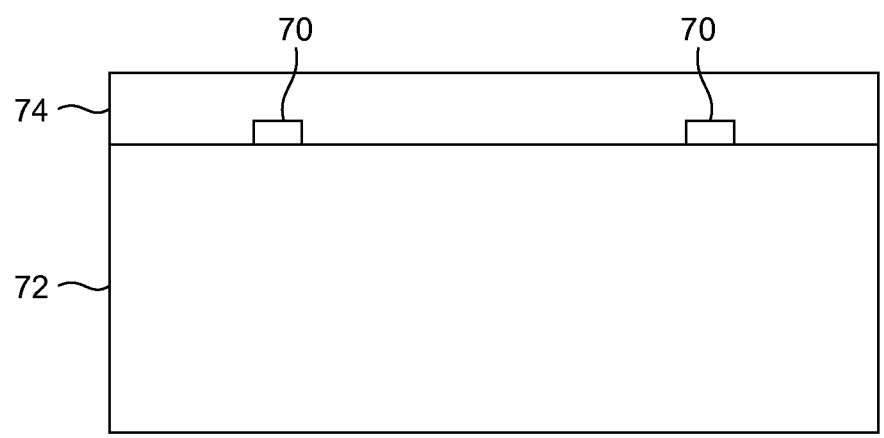
FIG. 12 is a sectional view taken along line 12-12 of FIG. 11.
Figure 13:
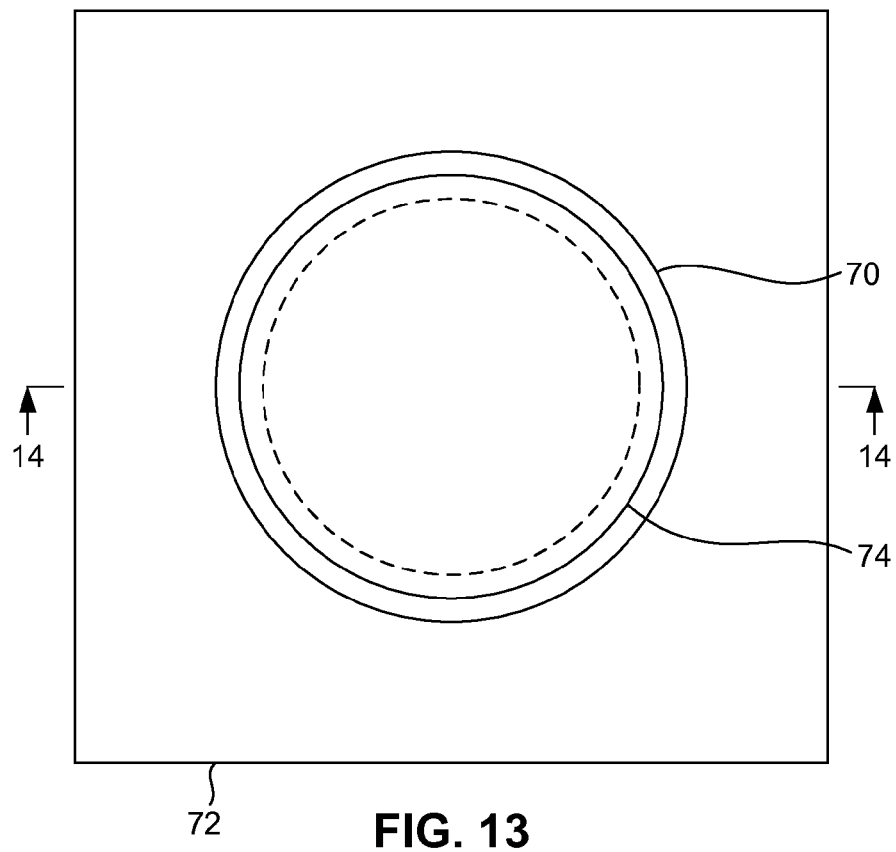
FIG. 13 is a top plan view illustrating a third step of an exemplary method for making the exemplary opto-electronic device of FIGS. 1-2.
Figure 14:
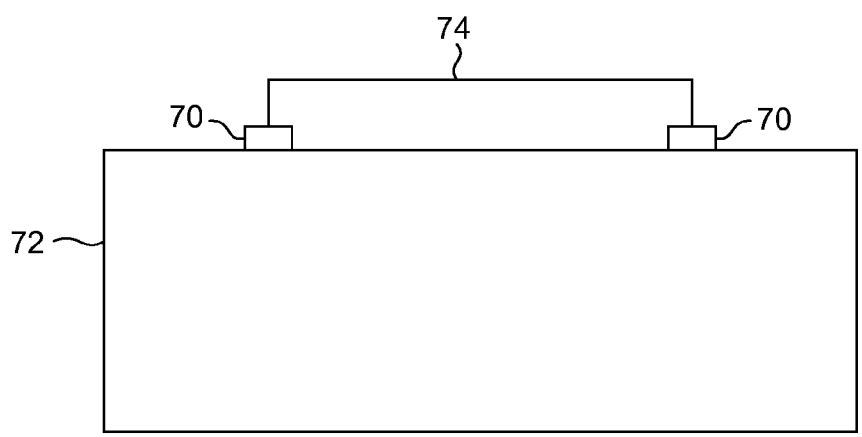
FIG. 14 is a sectional view taken along line 14-14 of FIG. 13.
Figure 15:
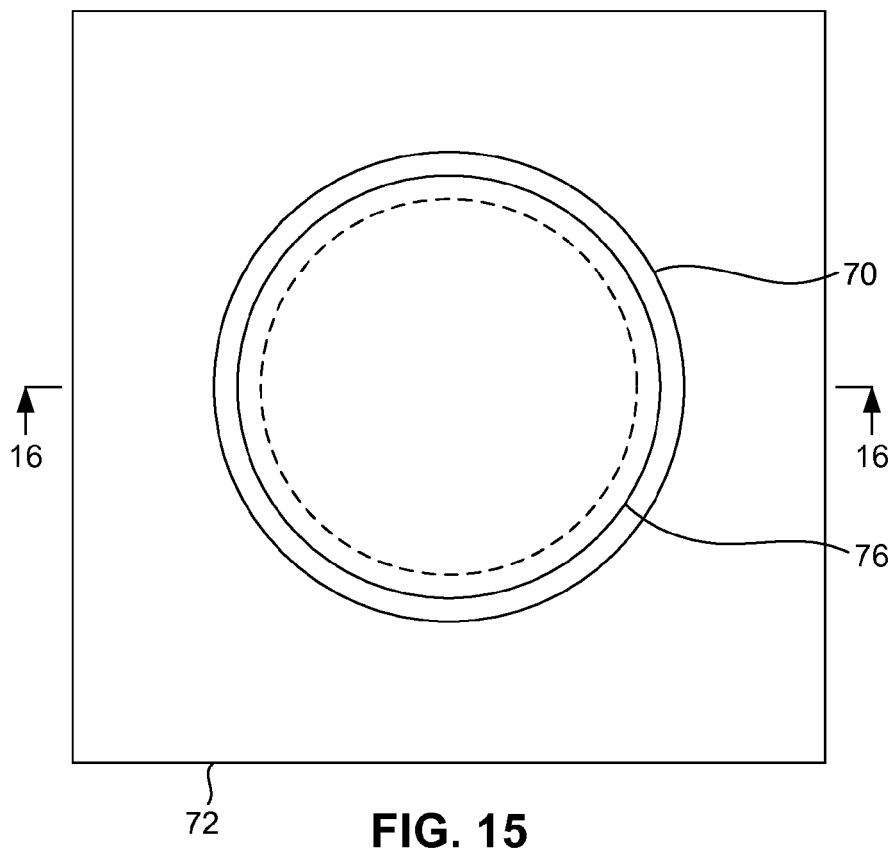
FIG. 15 is a top plan view illustrating a fourth step of an exemplary method for making the exemplary opto-electronic device of FIGS. 1-2.
Figure 16:
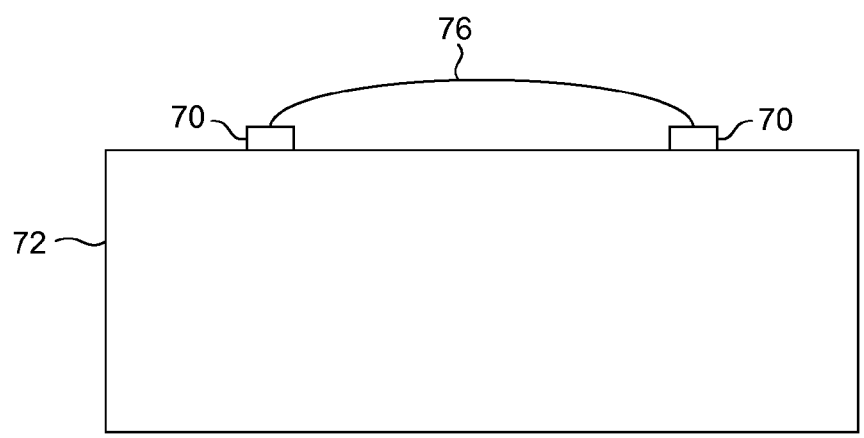
FIG. 16 is a sectional view taken along line 16-16 of FIG. 15.
Figure 17:
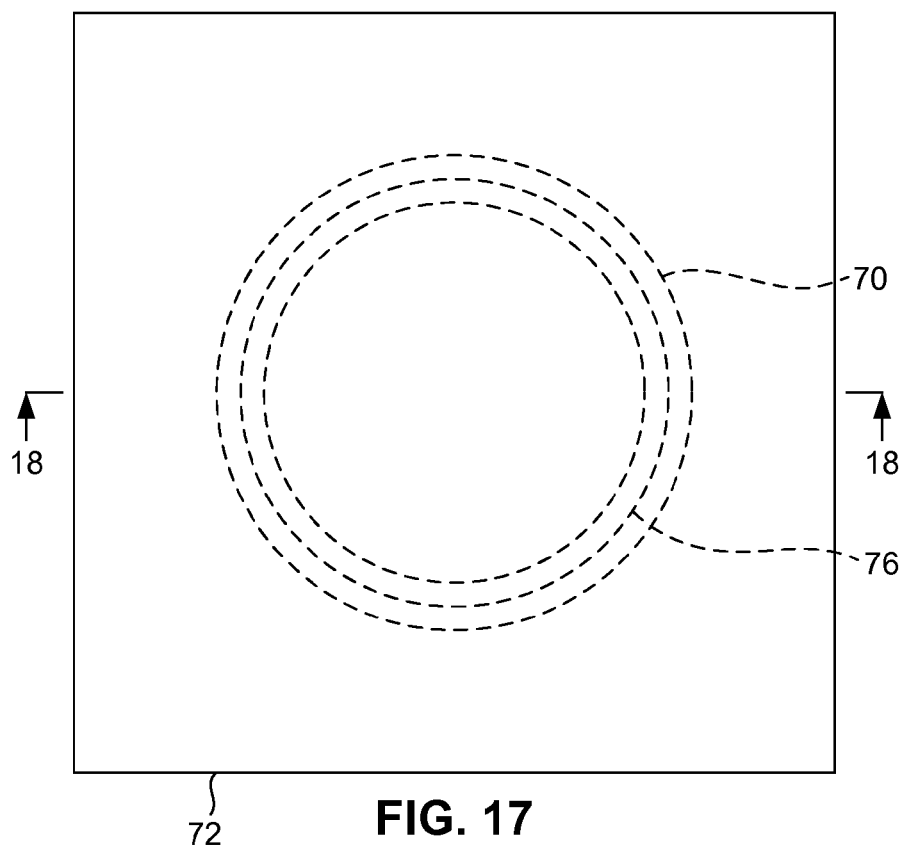
FIG. 17 is a top plan view illustrating a fifth step of an exemplary method for making the exemplary opto-electronic device of FIGS. 1-2.
Figure 18:
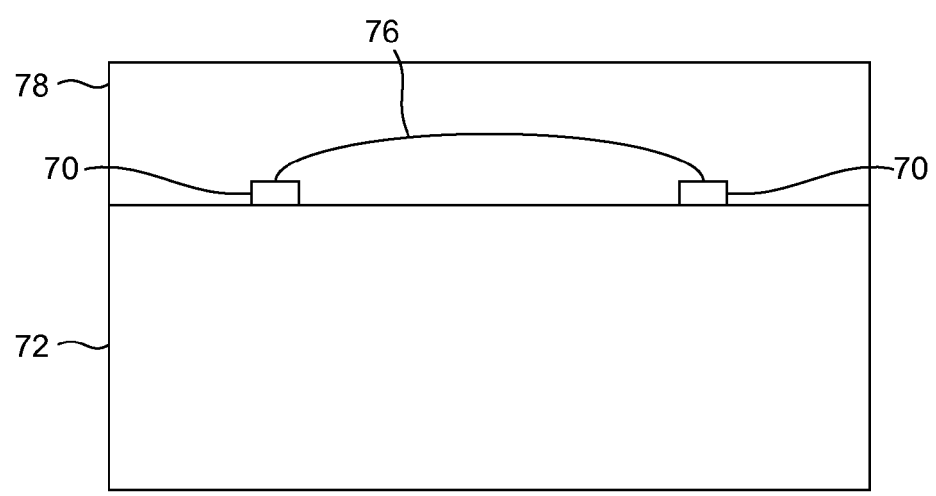
FIG. 18 is a sectional view taken along line 18-18 of FIG. 17.

An exemplary method for making opto-electronic device 10 (FIGS. 1-2) is illustrated in FIGS. 9-29. As illustrated in FIGS. 9-10, a mask is first formed by applying a layer of opaque material such as chromium 70 to the surface of a transparent substrate such as glass 72. Chromium 70 is patterned in an annular shape. The chromium-on-glass structure can be formed in a conventional manner. As illustrated in FIGS. 11-12, a layer of positive photoresist 74, such as a product known as AZ9260 available from AZ Electronic Materials S.A. of Luxembourg, is then applied (e.g., by spin coating) over chromium 70. As illustrated in FIGS. 13-14, positive photoresist 74 is patterned into a disc shape having a diameter less than the outer diameter of chromium 70 and greater than the inner diameter of chromium 70. As illustrated in FIGS. 15-16, positive photoresist 74 is subjected to a reflow process, which shapes positive photoresist 74 into a convex lens 76. A suitable reflow process involves, for example, heating the photoresist up to 160 C and maintaining it at that temperature for two minutes. As illustrated in FIGS. 17-18, a second layer of positive photoresist 78 is applied over convex lens 76 and subjected to a soft bake.

Figure 19:
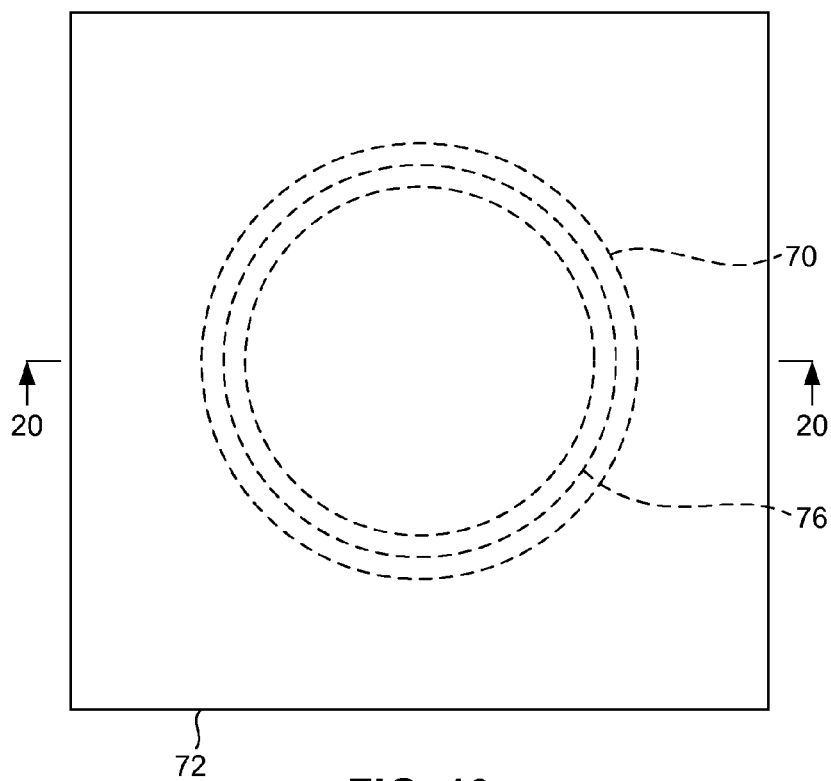
FIG. 19 is a top plan view illustrating a sixth step of an exemplary method for making the exemplary opto-electronic device of FIGS. 1-2.
Figure 20:
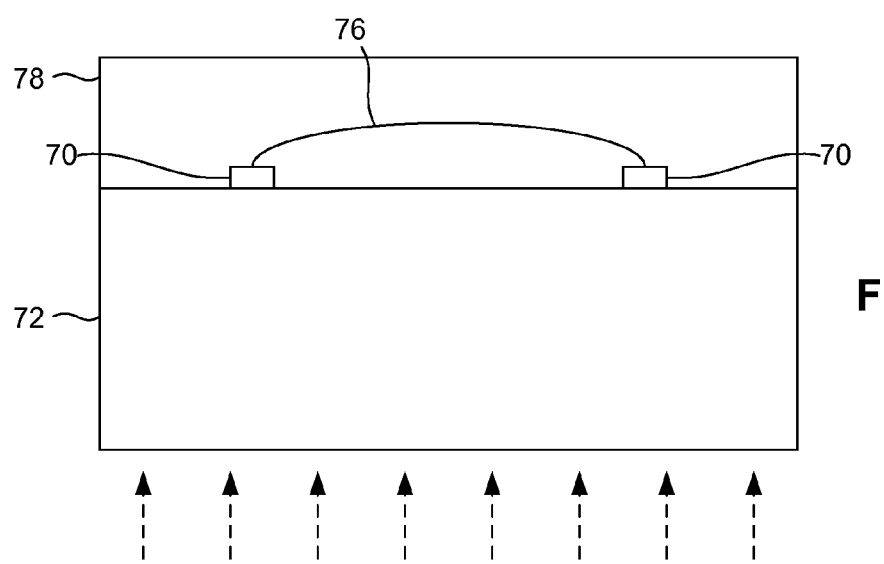
FIG. 20 is a sectional view taken along line 20-20 of FIG. 19.
Figure 21:
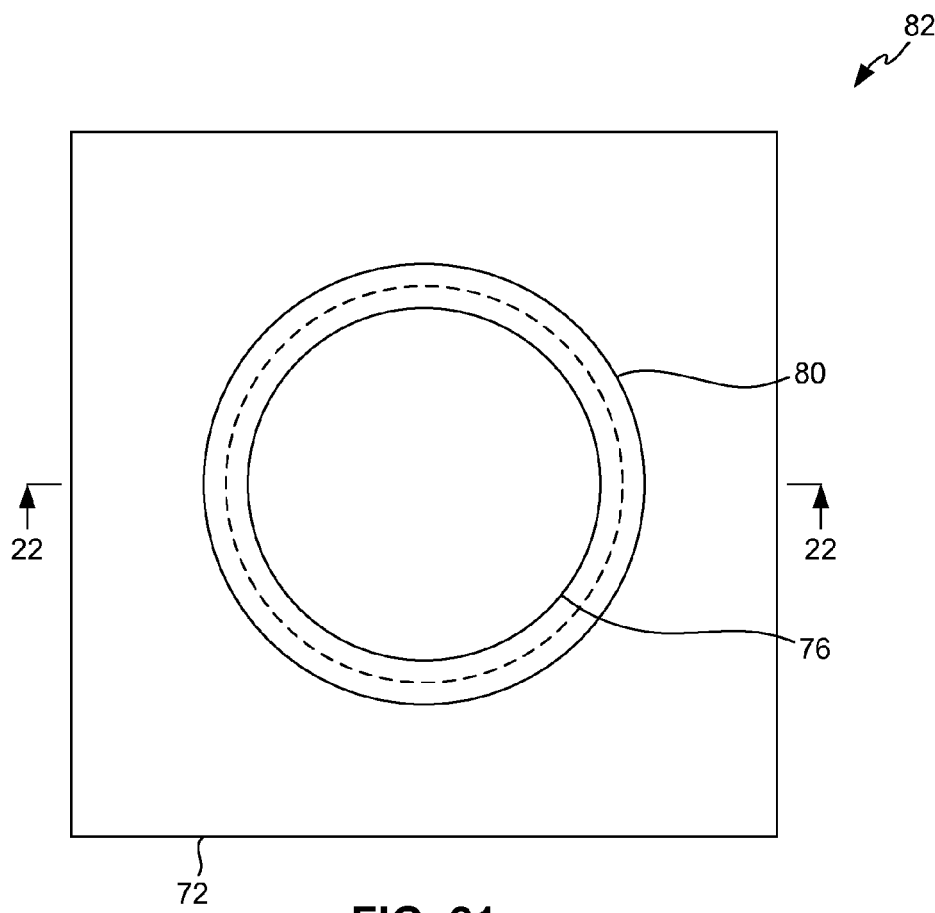
FIG. 21 is a top plan view illustrating a seventh step of an exemplary method for making the exemplary opto-electronic device of FIGS. 1-2.
Figure 22:
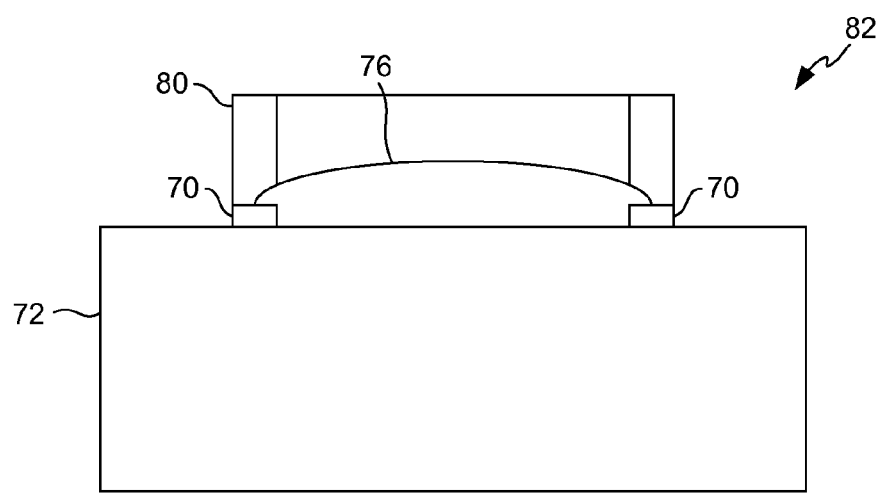
FIG. 22 is a sectional view taken along line 22-22 of FIG. 21.

As illustrated in FIGS. 19-20, the assembly (FIG. 18) is illuminated from the back or bottom, as indicated by the broken-line arrows in FIG. 20. As illustrated in FIGS. 21-22, subsequent developing removes the portion of positive photoresist 78 that was illuminated and leaves intact the barrel-shaped portion 80 of positive photoresist 78 that was masked by chromium 70. The prior reflow step ensures that convex lens 76 is not developed away. The resulting mask assembly 82 is used as described below.

Figure 23:
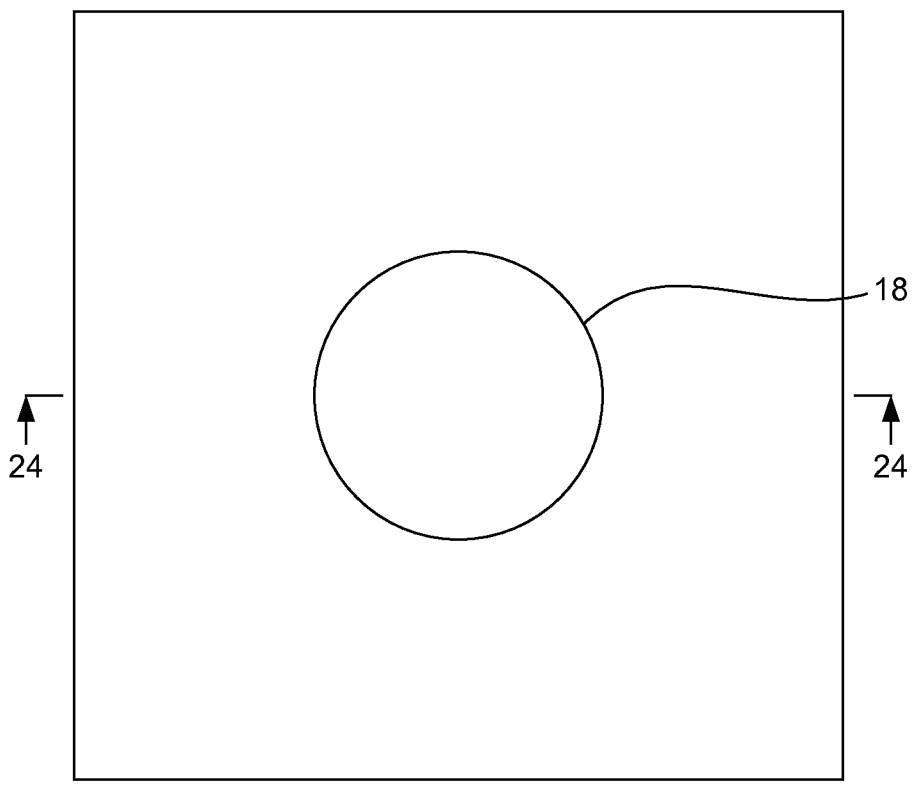
FIG. 23 is a top plan view illustrating an eighth step of an exemplary method for making the exemplary opto-electronic device of FIGS. 1-2.
Figure 24:
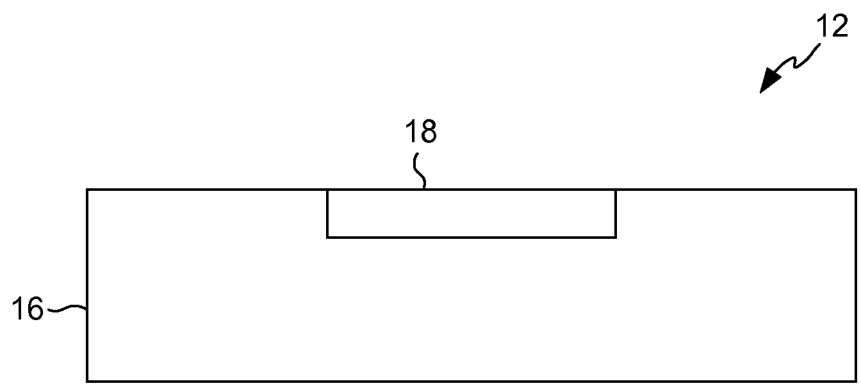
FIG. 24 is a sectional view taken along line 24-24 of FIG. 23.
Figure 25:
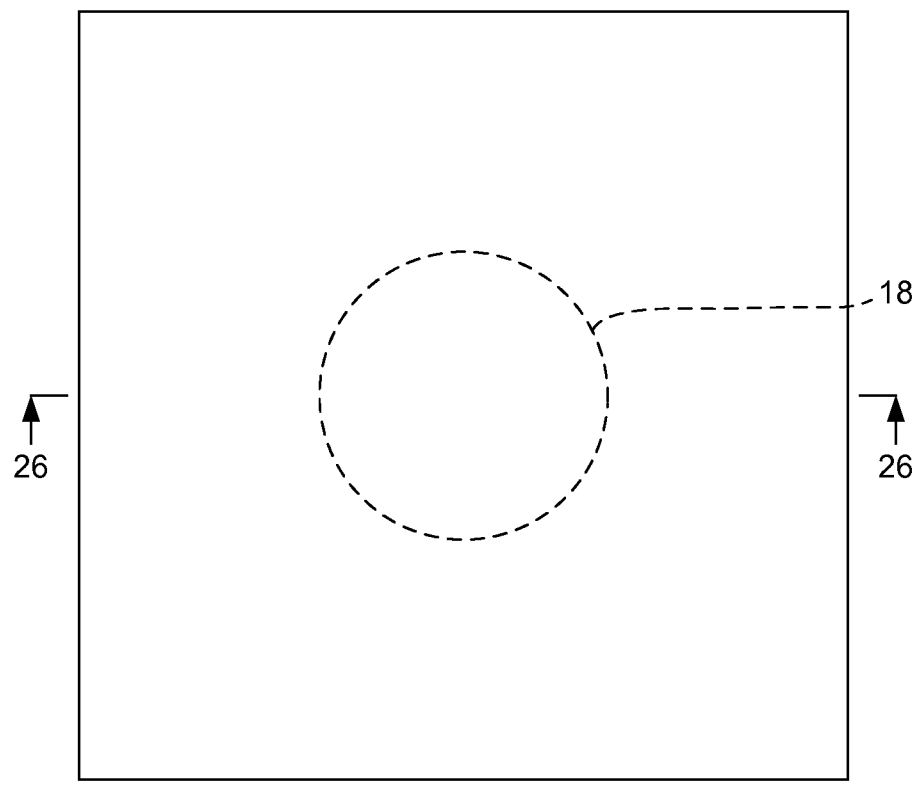
FIG. 25 is a top plan view illustrating a ninth step of an exemplary method for making the exemplary opto-electronic device of FIGS. 1-2.
Figure 26:
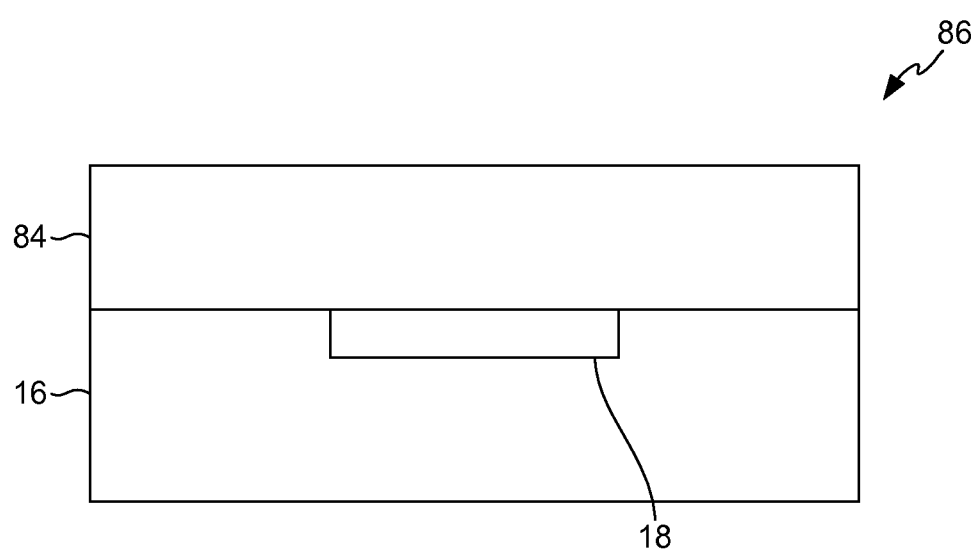
FIG. 26 is a sectional view taken along line 26-26 of FIG. 25.

As illustrated in FIGS. 23-24, semiconductor device 12 (described above with regard to FIGS. 1-2) is provided. Semiconductor device 12 can comprise, for example, a PIN photodiode or other suitable photodetector. As illustrated in FIGS. 25-26, a layer of positive photoresist 84 is applied (e.g., by spin coating) to the surface of semiconductor device 12, covering active area 18 and surrounding areas. The resulting assembly 86 is used with the above-described mask assembly 82 (FIG. 22) in the following steps.

Figure 27:
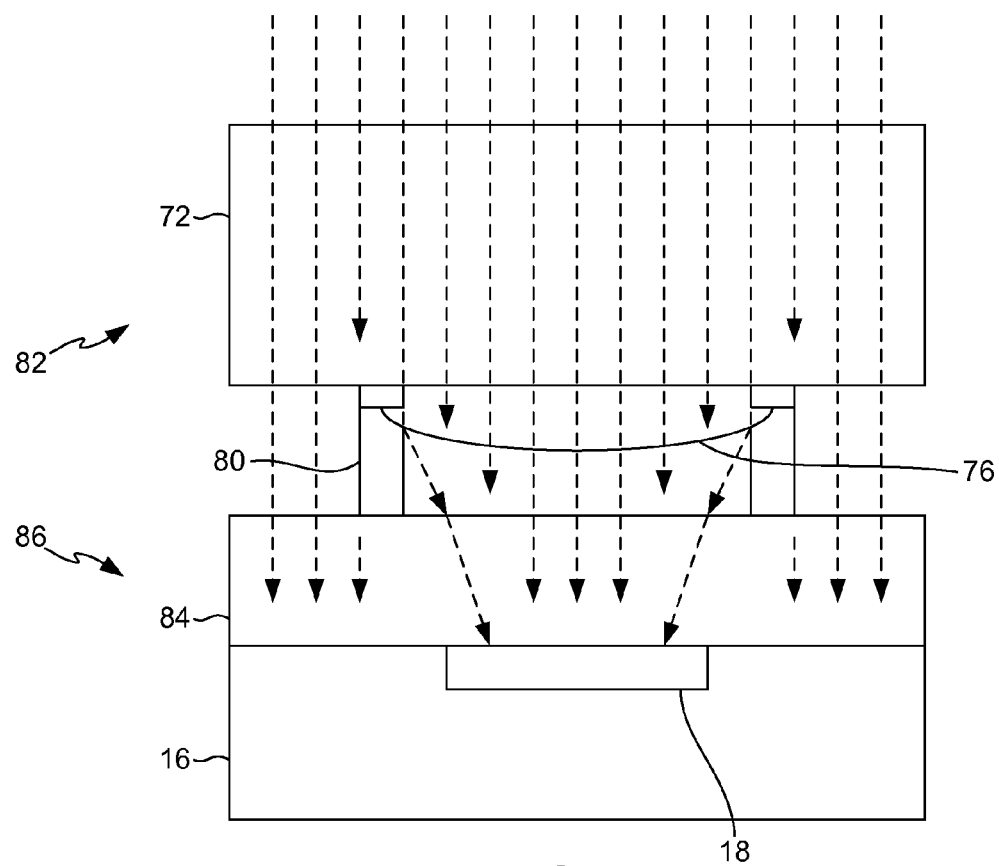
FIG. 27 is a sectional view illustrating a tenth step of an exemplary method for making the exemplary opto-electronic device of FIGS. 1-2.
Figure 28:
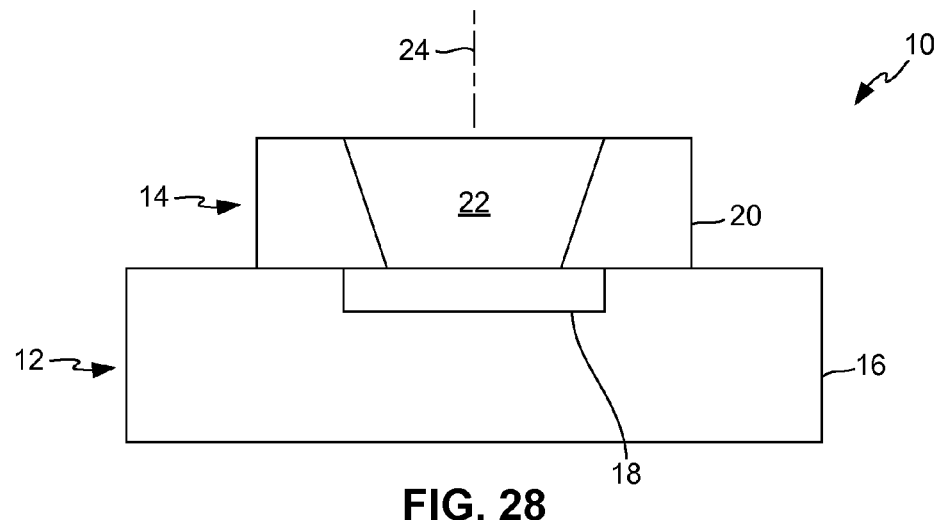
FIG. 28 is a sectional view illustrating an eleventh step of an exemplary method for making the exemplary opto-electronic device of FIGS. 1-2.

As illustrated in FIG. 27, mask assembly 82 is placed on top of assembly 86 and illuminated from the top, as indicated by the broken-line arrows in FIG. 27. Barrel-shaped portion 80 of mask assembly 82 serves as a standoff to ensure proper spacing. Note that the light is transmitted through all of glass 72 and through convex lens 76. Convex lens 76 bends or images the light into a cone shape, and refraction further narrows the cone of light as the light enters positive photoresist 84. Thus, a cone-shaped region within positive photoresist 84 is illuminated. Subsequent developing removes the portion of positive photoresist 84 that was illuminated and leaves intact the portion of positive photoresist 84 that was not illuminated. The portion of positive photoresist 84 that was not illuminated defines body 20 of the resulting non-imaging optical concentrator 14 (FIG. 28). Removal of the portion of positive photoresist 84 that was illuminated defines cavity region 22 of the resulting non-imaging optical concentrator 14.

Figure 29:
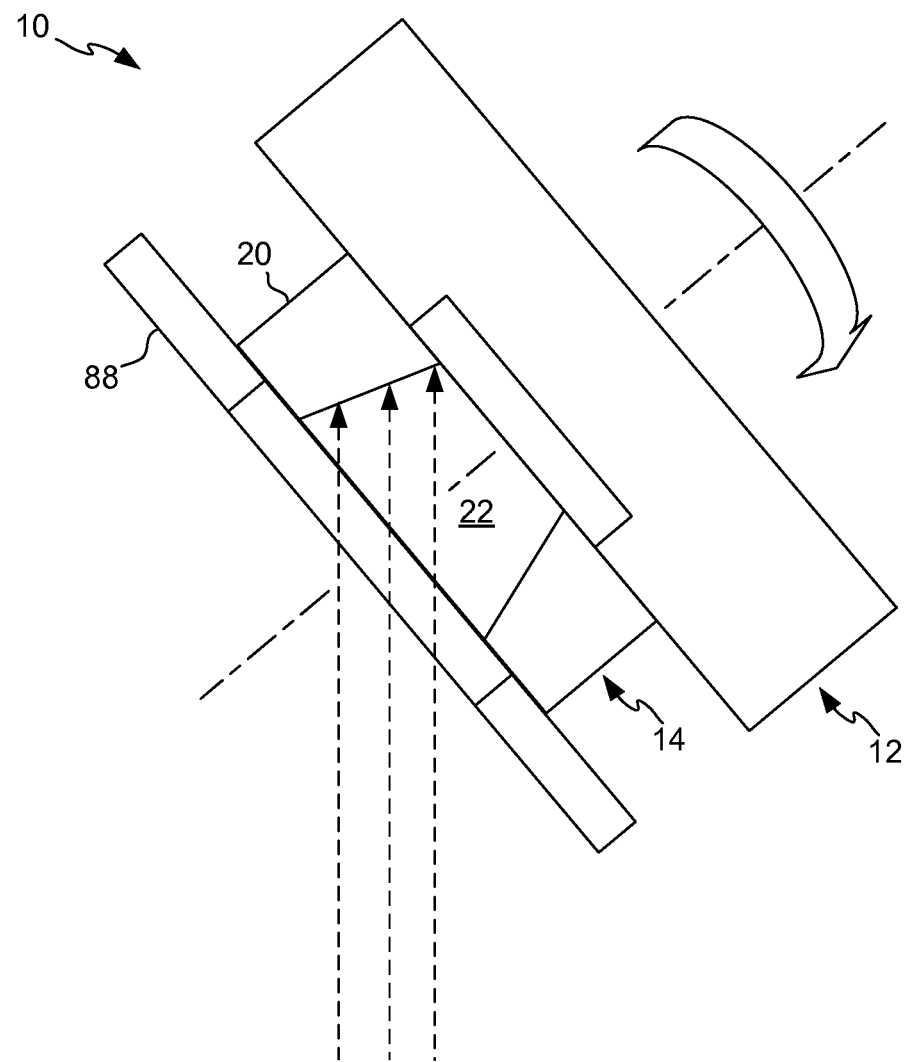
FIG. 29 is a sectional view illustrating a twelfth step of an exemplary method for making the exemplary opto-electronic device of FIGS. 1-2.

As illustrated in FIG. 29, a shadow mask 88 is placed on the top of body 20. The shadow mask opening is aligned with cavity region 22. The entire assembly comprising semiconductor device 12 and non-imaging optical concentrator 14 is rotated relative on an axis at an oblique angle to the direction of a source of metal in a metal deposition process, indicated by broken-line arrows. It is suitable for the deposition to be done by evaporation, where the metal is deposited in a line-of-sight from the source to the sidewalls of cavity region 22. An optically reflective metal, such as gold, is suitable. Shadow mask 88 masks active area 18 while allowing metal to be deposited on the sidewalls of cavity region 22. The metal is evenly deposited around the sidewalls of cavity region 22 as the assembly is rotated.

Although not shown, an alternative method for making opto-electronic device 10 includes providing a mold having a shape corresponding to non-imaging optical concentrator 14. The mold is filled with a light-curable infrared-transparent liquid and lowered onto the top of semiconductor device 12. The mold is then irradiated with ultraviolet light to cure the liquid material, thereby forming optical concentrator 14. The mold is removed, and metal is deposited on the sidewalls of cavity region 22 in the manner described above.

Figure 30:
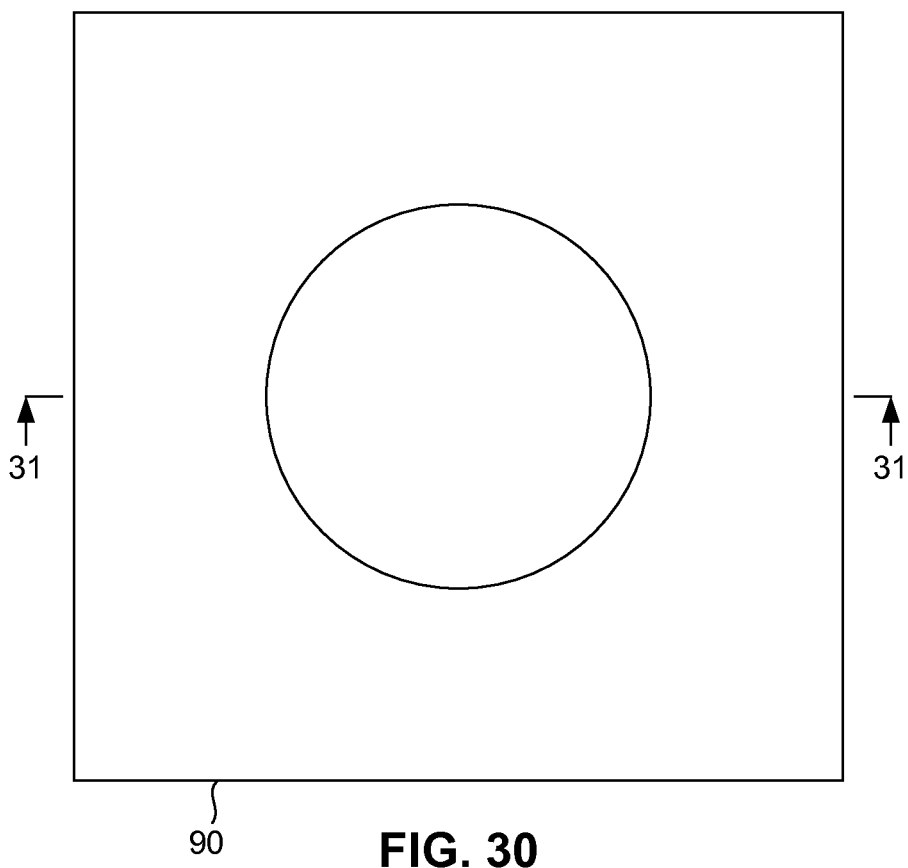
FIG. 30 is a top plan view illustrating a first step of an exemplary method for making the exemplary opto-electronic device of FIGS. 5-6.
Figure 31:
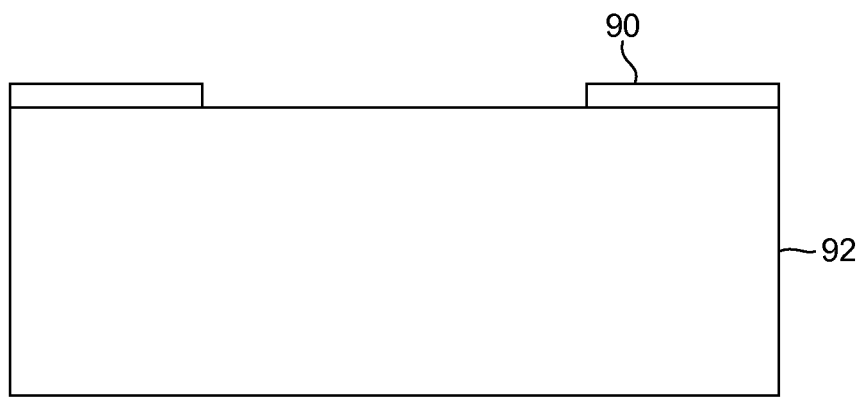
FIG. 31 is a sectional view taken along line 31-31 of FIG. 30.
Figure 32:
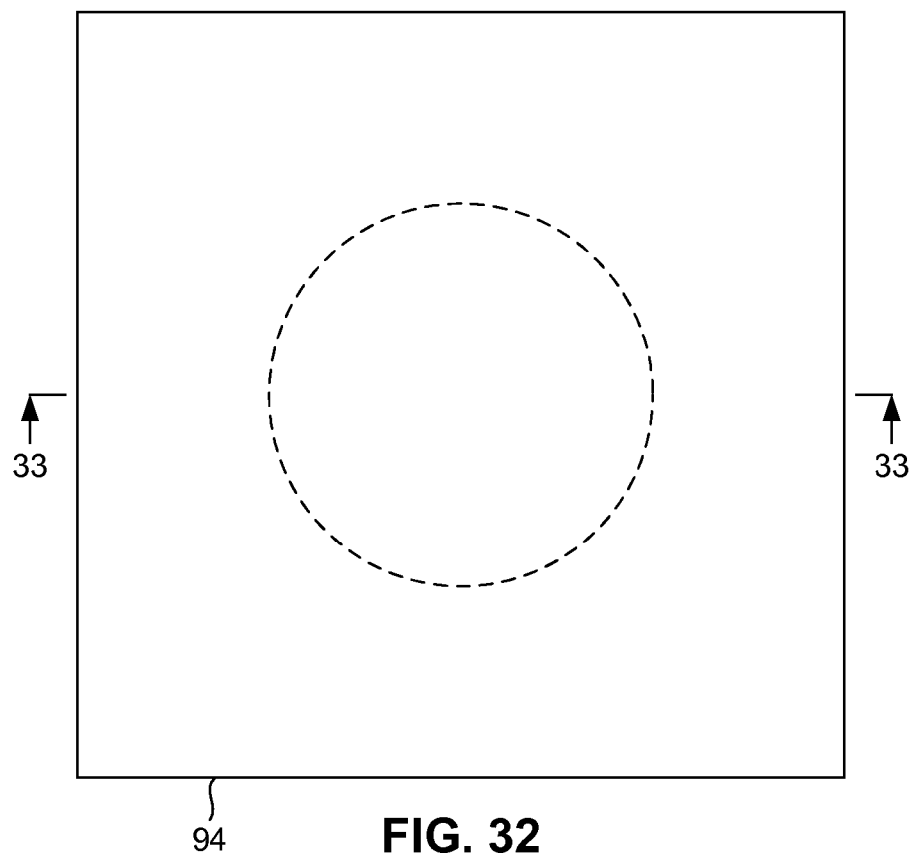
FIG. 32 is a top plan view illustrating a second step of an exemplary method for making the exemplary opto-electronic device of FIGS. 5-6.
Figure 33:
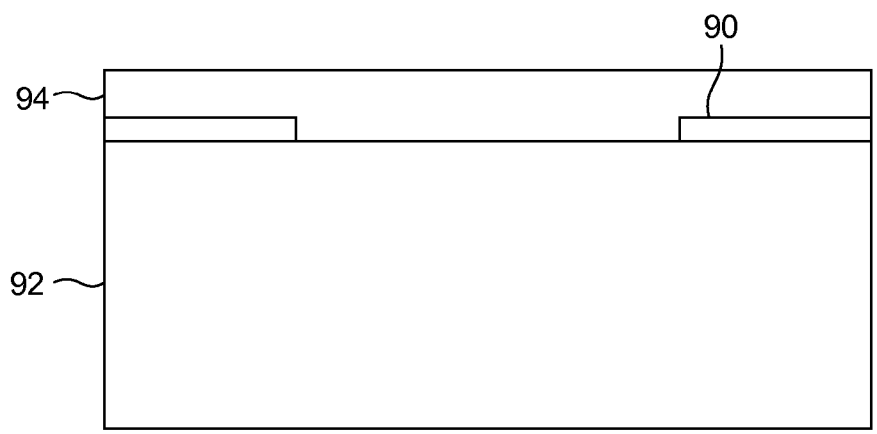
FIG. 33 is a sectional view taken along line 33-33 of FIG. 32.
Figure 34:
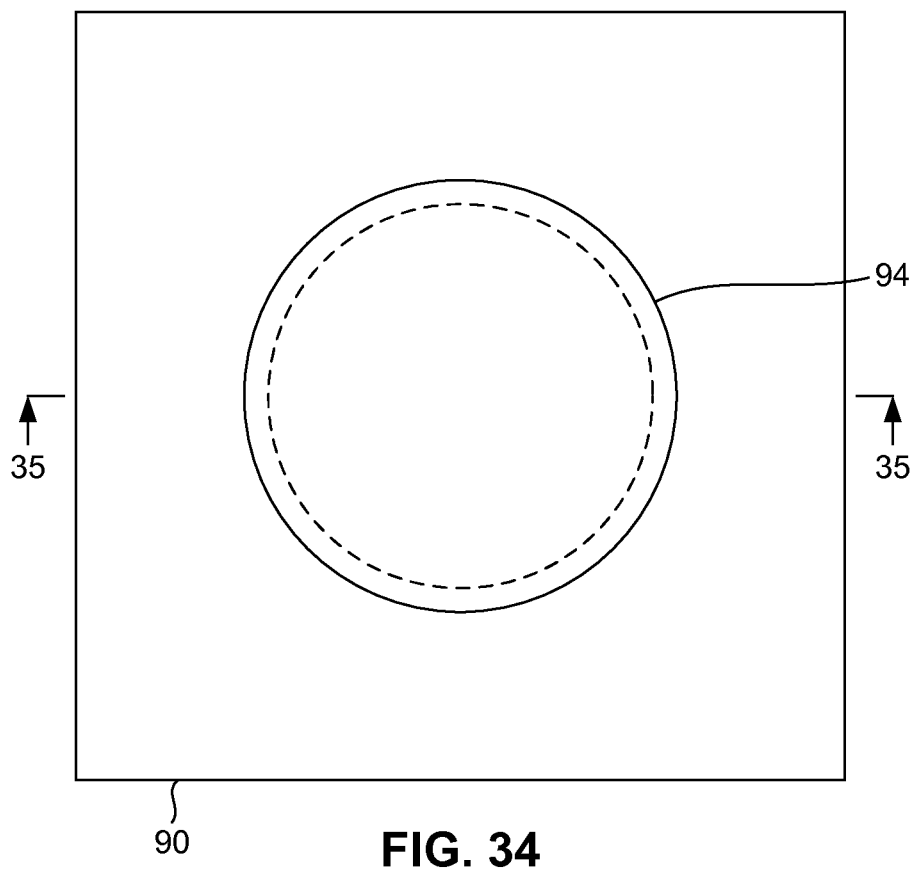
FIG. 34 is a top plan view illustrating a third step of an exemplary method for making the exemplary opto-electronic device of FIGS. 5-6.
Figure 35:
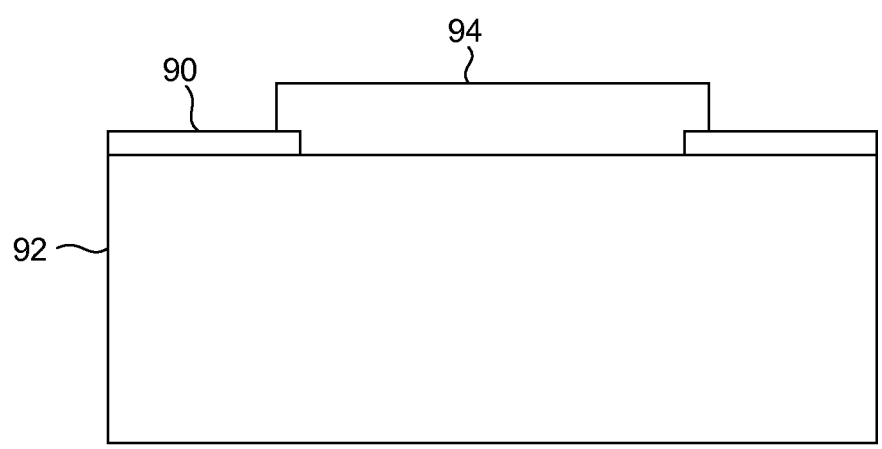
FIG. 35 is a sectional view taken along line 35-35 of FIG. 34.
Figure 36:
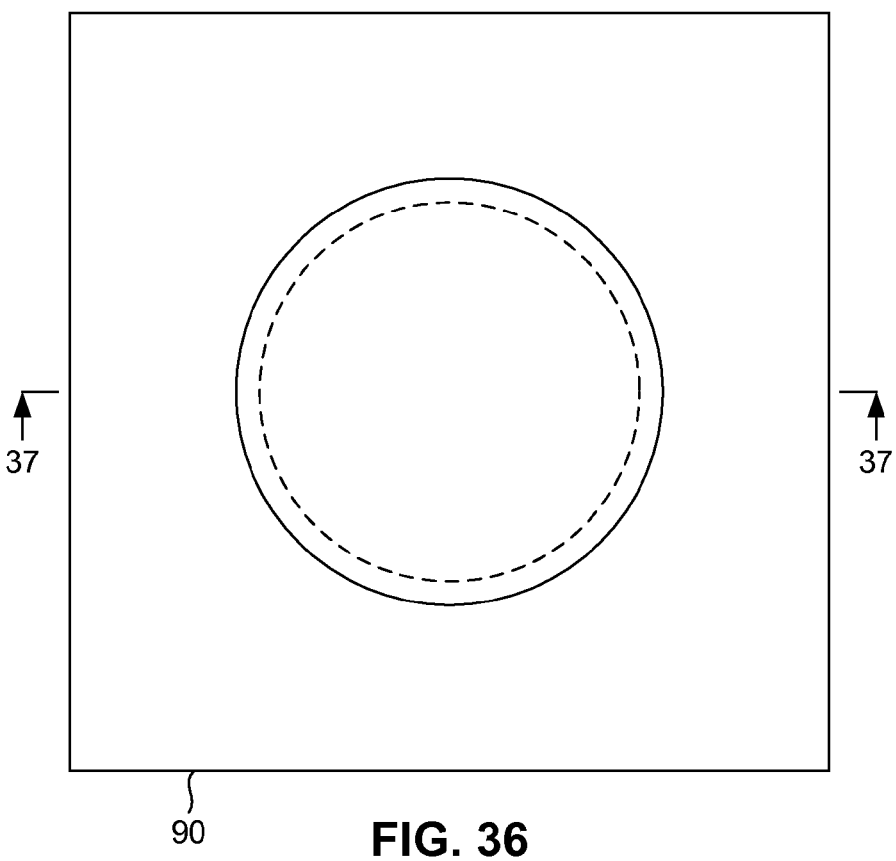
FIG. 36 is a top plan view illustrating a fourth step of an exemplary method for making the exemplary opto-electronic device of FIGS. 5-6.
Figure 37:
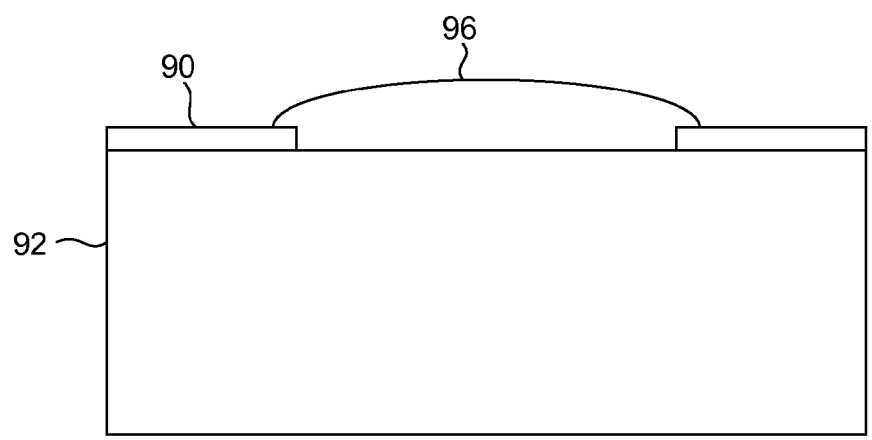
FIG. 37 is a sectional view taken along line 37-37 of FIG. 36.
Figure 38:
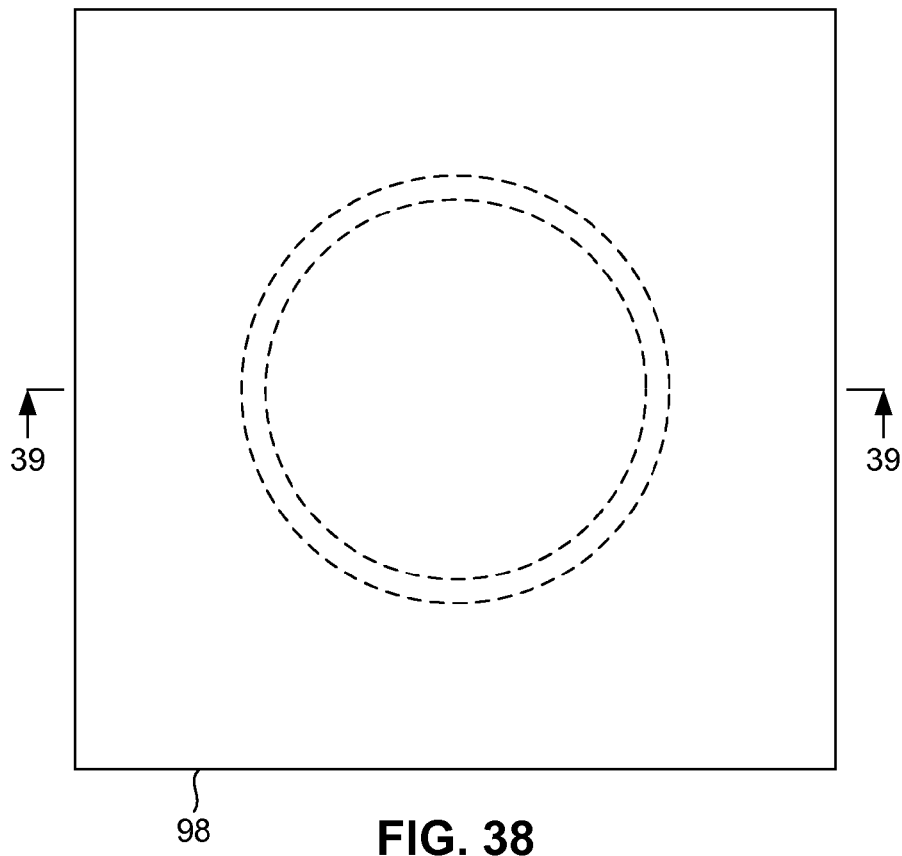
FIG. 38 is a top plan view illustrating a fifth step of an exemplary method for making the exemplary opto-electronic device of FIGS. 5-6.
Figure 39:
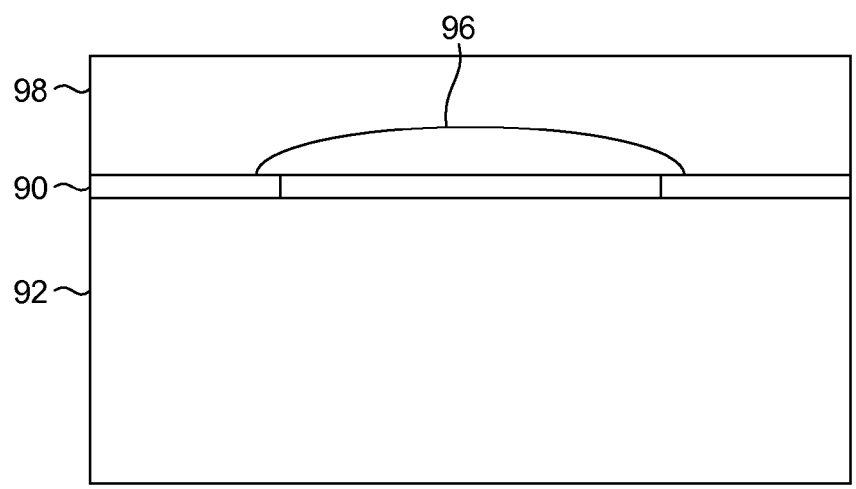
FIG. 39 is a sectional view taken along line 39-39 of FIG. 38.

An exemplary method for making opto-electronic device 42 (FIGS. 5-6) is illustrated in FIGS. 30-49. As illustrated in FIGS. 30-31, a mask is first formed by applying a layer of opaque material such as chromium 90 to the surface of a transparent substrate such as glass 92. Chromium 90 is patterned in shape having a circular opening. As illustrated in FIGS. 32-33, a layer of positive photoresist 94 is then applied (e.g., by spin coating) over chromium 90. As illustrated in FIGS. 34-35, positive photoresist 94 is patterned into a disc shape having a diameter less than the outer diameter of the circular opening in chromium 90 and greater than the inner diameter of the circular opening in chromium 90. As illustrated in FIGS. 36-37, positive photoresist 94 is subjected to a reflow process, which shapes positive photoresist 94 into a convex lens 96. As illustrated in FIGS. 38-39, a second layer of positive photoresist 98 is applied over convex lens 96 and subjected to a soft bake.

Figure 40:
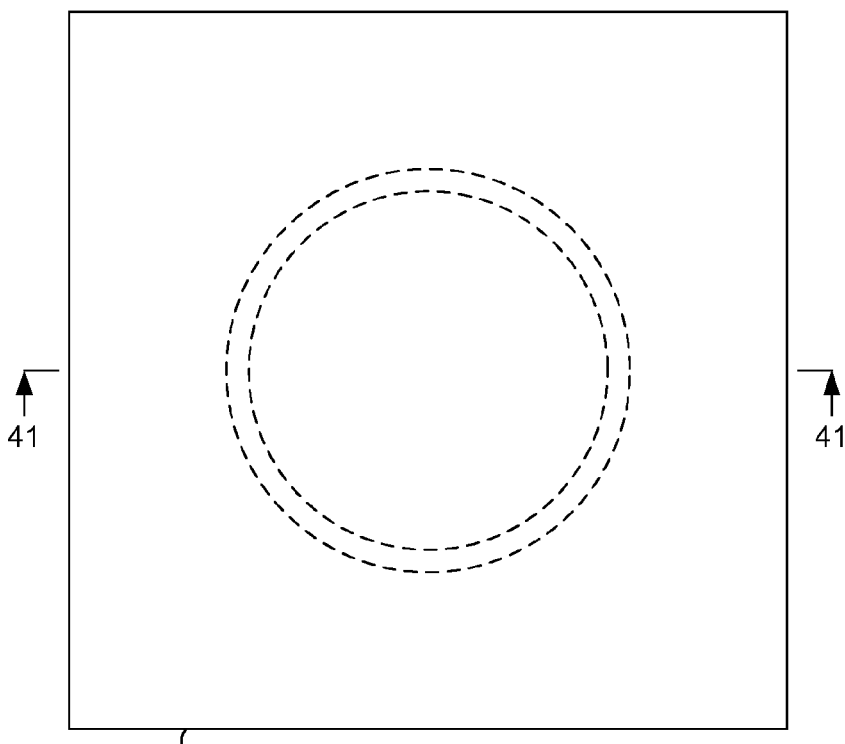
FIG. 40 is a top plan view illustrating a sixth step of an exemplary method for making the exemplary opto-electronic device of FIGS. 5-6.
Figure 41:
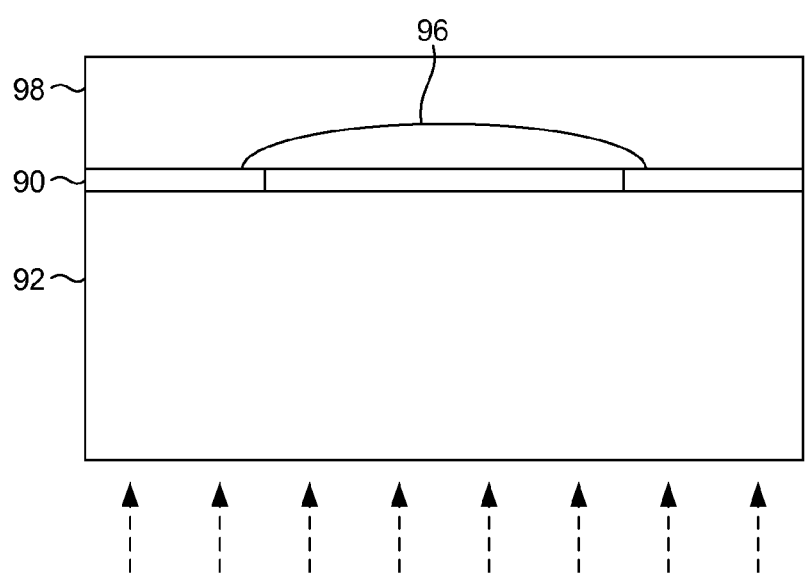
FIG. 41 is a sectional view taken along line 41-41 of FIG. 40.
Figure 42:
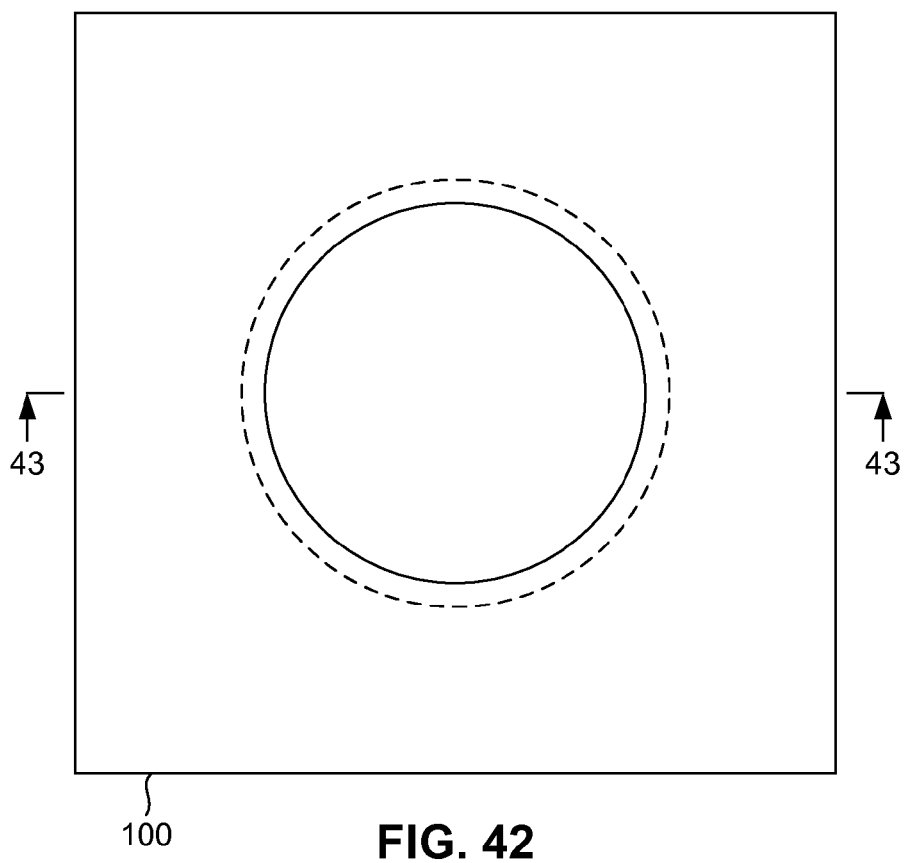
FIG. 42 is a top plan view illustrating a seventh step of an exemplary method for making the exemplary opto-electronic device of FIGS. 5-6.
Figure 43:
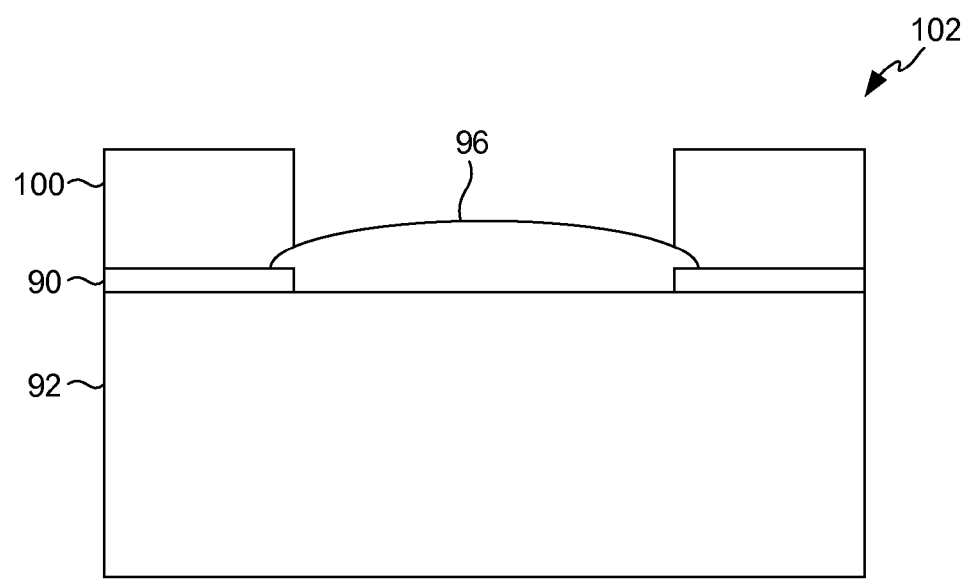
FIG. 43 is a sectional view taken along line 43-43 of FIG. 42.

As illustrated in FIGS. 40-41, the assembly (FIG. 39) is illuminated from the back or bottom, as indicated by the broken-line arrows in FIG. 41. As illustrated in FIGS. 42-43, subsequent developing removes the portion of positive photoresist 98 that was illuminated and leaves intact a portion 100 of positive photoresist 78 that was masked by chromium 70. Portion 100 has a circular opening corresponding to the circular opening in chromium 90. The prior reflow step ensures that convex lens 96 is not developed away. The resulting mask assembly 102 is used as described below.

Figure 44:
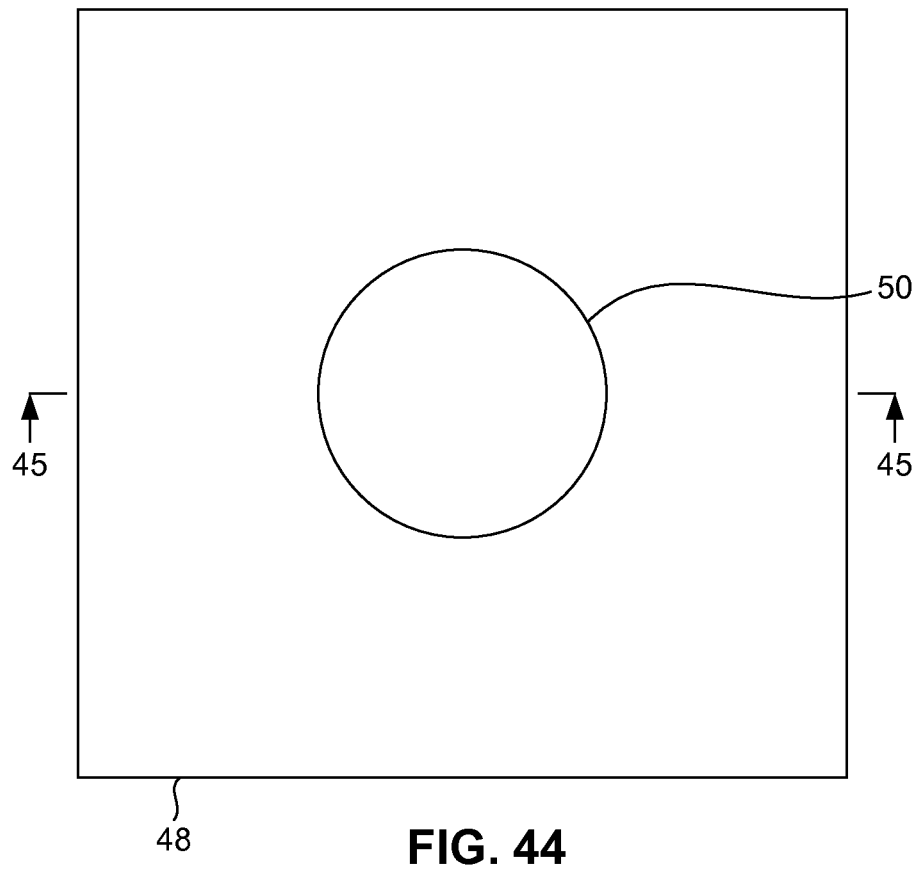
FIG. 44 is a top plan view illustrating an eighth step of an exemplary method for making the exemplary opto-electronic device of FIGS. 5-6.
Figure 45:
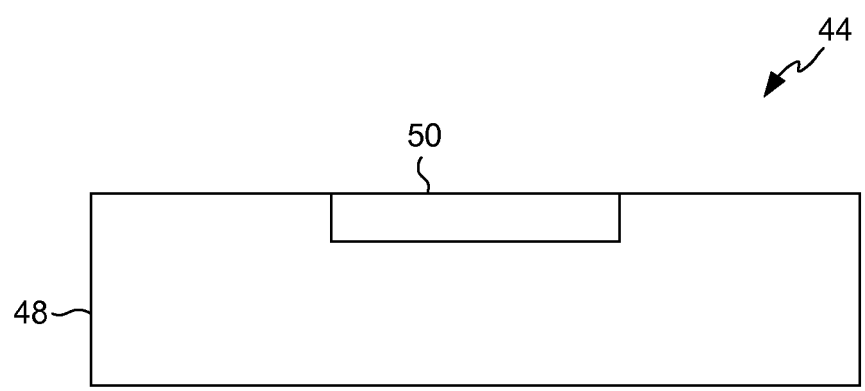
FIG. 45 is a sectional view taken along line 45-45 of FIG. 44.
Figure 46:
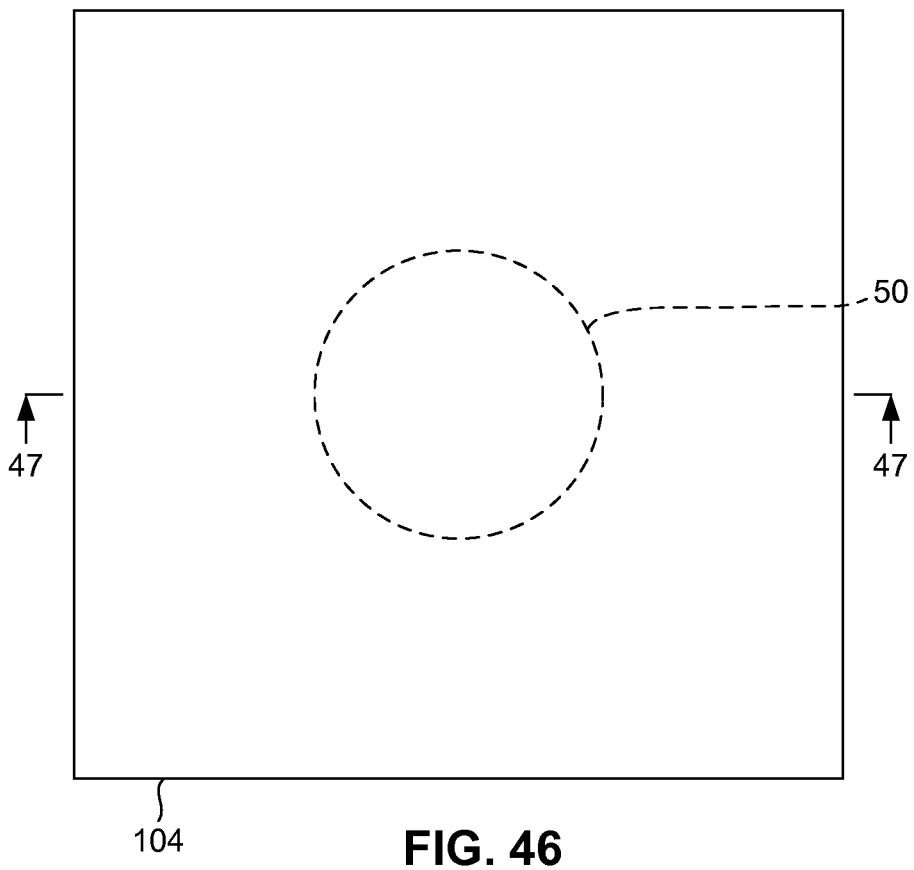
FIG. 46 is a top plan view illustrating a ninth step of an exemplary method for making the exemplary opto-electronic device of FIGS. 5-6.
Figure 47:
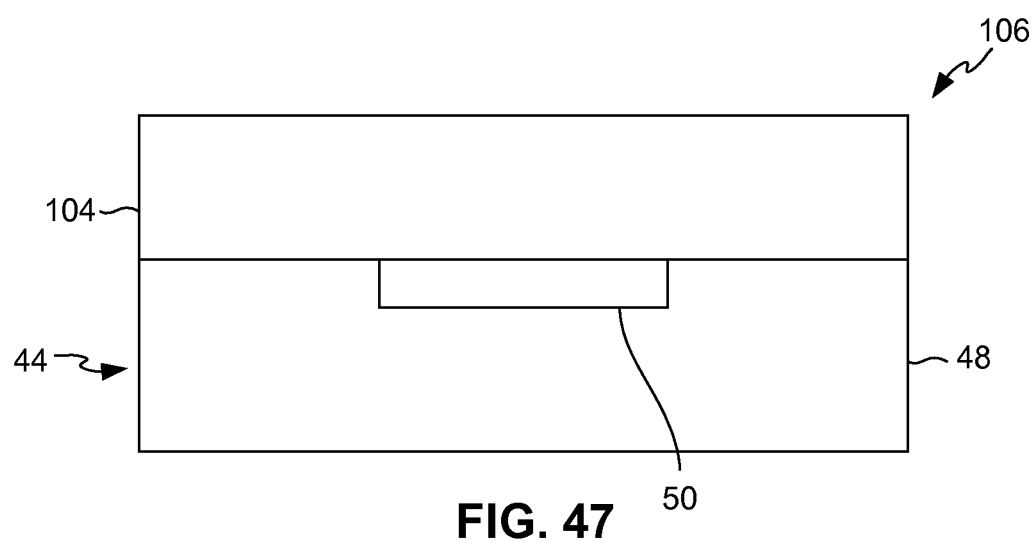
FIG. 47 is a sectional view taken along line 47-47 of FIG. 46.

As illustrated in FIGS. 44-45, semiconductor device 44 (described above with regard to FIGS. 5-6) is provided. Semiconductor device 44 can comprise, for example, a PIN photodiode or other suitable photodetector. As illustrated in FIGS. 46-47, a layer of negative photoresist 104 is applied (e.g., by spin coating) to the surface of semiconductor device 44, covering active area 50 and surrounding areas. The resulting assembly 106 is used with the above-described mask assembly 102 (FIG. 43) in the following steps.

Figure 48:
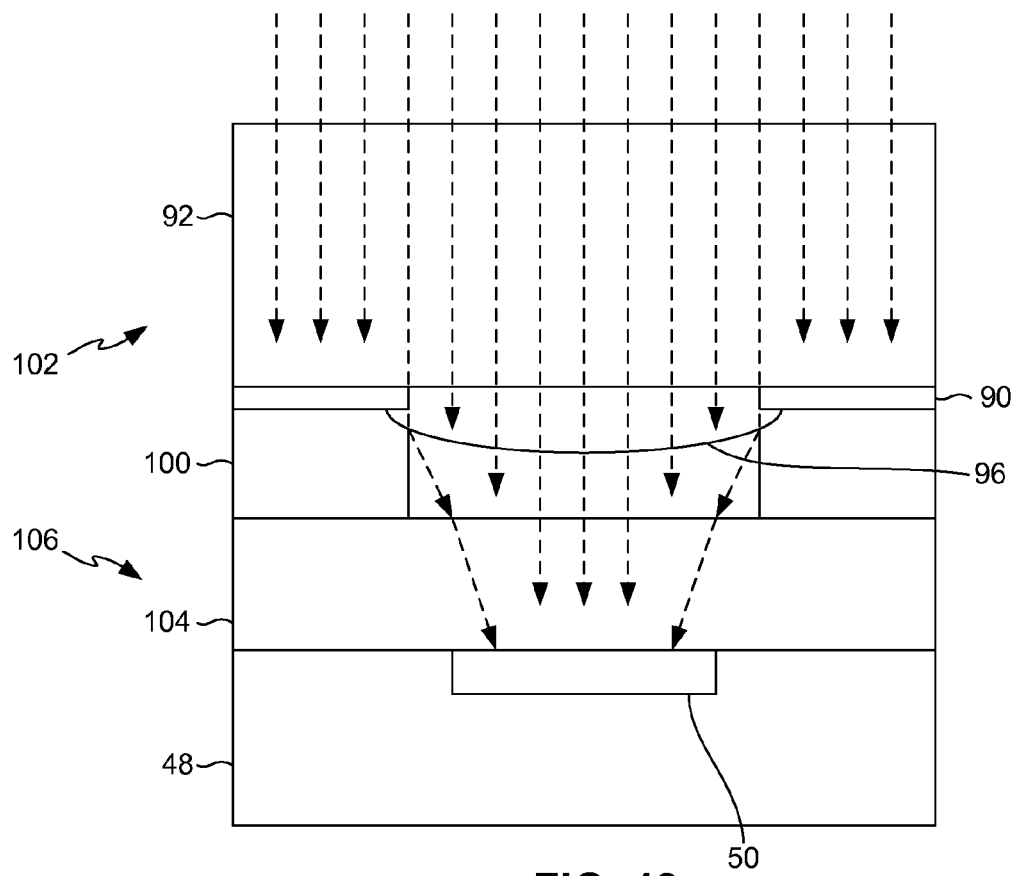
FIG. 48 is a sectional view illustrating a tenth step of an exemplary method for making the exemplary opto-electronic device of FIGS. 5-6.
Figure 49:
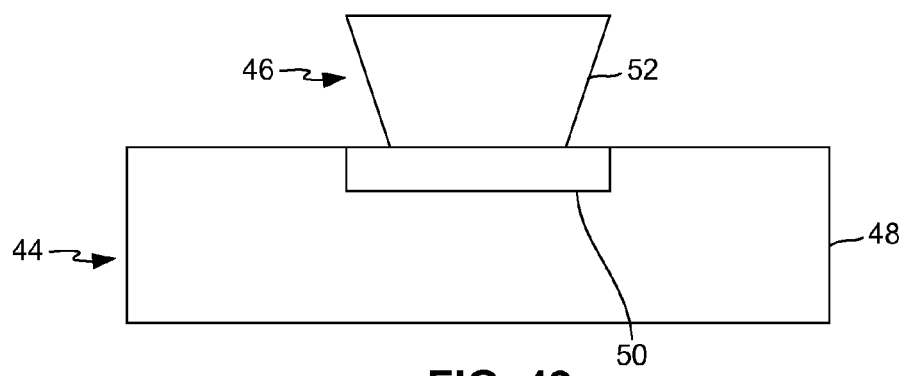
FIG. 49 is a sectional view illustrating an eleventh step of an exemplary method for making the exemplary opto-electronic device of FIGS. 5-6.

As illustrated in FIG. 48, mask assembly 102 is placed on top of assembly 106 and illuminated from the top, as indicated by the broken-line arrows in FIG. 48. Portion 100 of mask assembly 102 serves as a standoff to ensure proper spacing. Note that the light is transmitted through all of glass 92 and through convex lens 96. Convex lens 96 bends or images the light into a cone shape, and refraction further narrows the cone of light as the light enters negative photoresist 104. Thus, a cone-shaped region within negative photoresist 104 is illuminated. Subsequent developing removes the portion of negative photoresist 104 that was not illuminated and leaves intact the portion of negative photoresist 104 that was illuminated. The portion of negative photoresist 104 that was illuminated defines solid region 52 of the resulting non-imaging optical concentrator 46 (FIG. 49).

Figure 50:
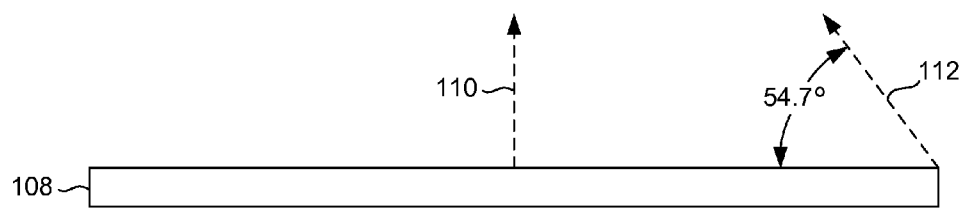
FIG. 50 is a sectional view illustrating a first step of an exemplary method for making the exemplary opto-electronic device of FIGS. 3-4.

An exemplary method for making opto-electronic device 26 (FIGS. 3-4) is illustrated in FIGS. 50-55. The method involves a well-known technique called anisotropic etching. As illustrated in FIG. 50, a wafer of a suitable semiconductor material such as silicon 108 is provided. As the crystalline structure is important in this method, silicon 108 is preferably <100> silicon. The arrow 110 indicates the <100> direction, i.e., the direction normal to the <100> crystal plane. The <111> direction, indicated by the arrow 112, is also important in this method. Note that the angle between the <100> and <111> directions is 54.7 degrees. Silicon 108 should be cleaned (e.g., so-called "RCA clean") prior to the remaining steps.

Figure 51:
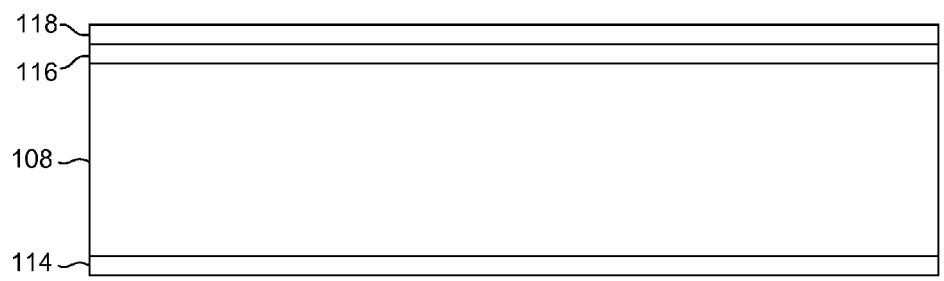
FIG. 51 is a sectional view illustrating a second step of an exemplary method for making the exemplary opto-electronic device of FIGS. 3-4.
Figure 52:
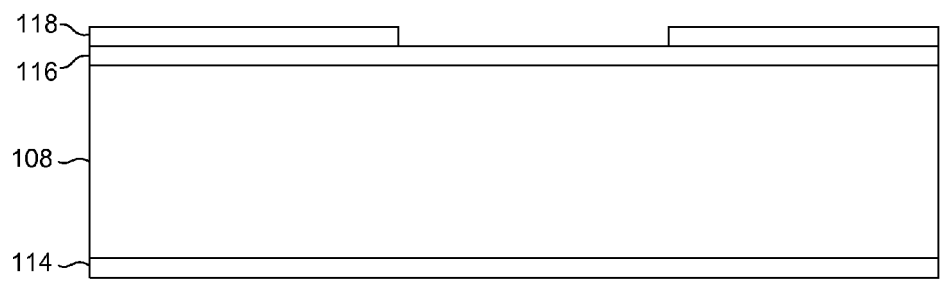
FIG. 52 is a sectional view illustrating a third step of an exemplary method for making the exemplary opto-electronic device of FIGS. 3-4.
Figure 53:
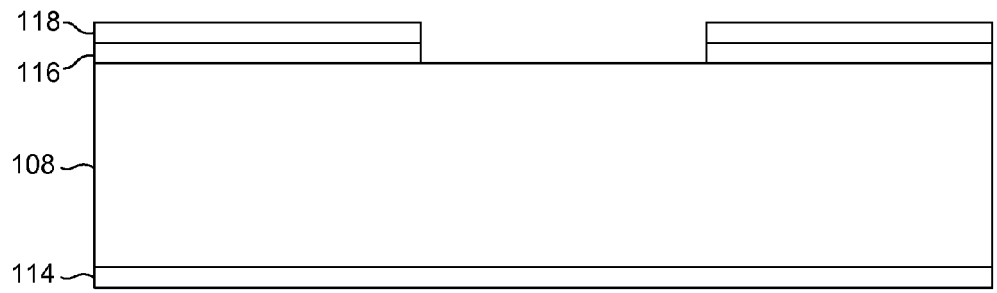
FIG. 53 is a sectional view illustrating a fourth step of an exemplary method for making the exemplary opto-electronic device of FIGS. 3-4.
Figure 54:
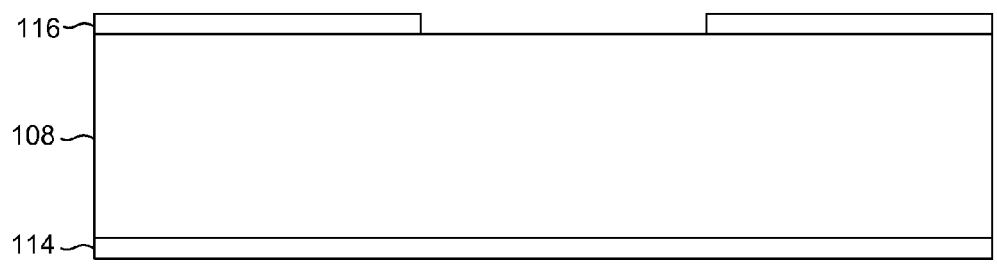
FIG. 54 is a sectional view illustrating a fifth step of an exemplary method for making the exemplary opto-electronic device of FIGS. 3-4.
Figure 55:
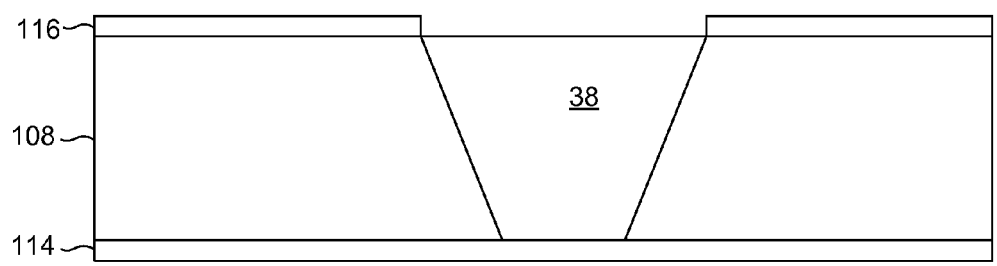
FIG. 55 is a sectional view illustrating a sixth step of an exemplary method for making the exemplary opto-electronic device of FIGS. 3-4.

As illustrated in FIG. 51, silicon 108 can be subjected to thermal oxidation (e.g., about 900-1100 C) to create oxide layers 114 and 116 on the wafer surfaces. A layer of positive photoresist 118 is then applied (e.g., by spin coating) over oxide layer 116. As illustrated in FIG. 52, a circular opening is then formed in positive photoresist 118. As illustrated in FIG. 53, an oxide etch process is then performed to form a circular opening in oxide layer 116 corresponding to the circular opening in positive photoresist 118. During the oxide etch, the back or bottom side of the structure should be protected with photoresist or wax (not shown) or by placing the structure on a glass plate (not shown). Positive photoresist 118 is removed following the oxide etch. The resulting structure having a circular opening in oxide layer 116 is shown in FIG. 54.

The structure (FIG. 54) is then subjected to a potassium hydroxide (KOH) etch. It is well known that <100> silicon etches anisotropically, such that the etched area has walls oriented at a 54.7 degree angle from the <100> crystal plane. This occurs because KOH displays an etch rate selectivity roughly 400 times higher in <100> crystal directions than in <111> crystal directions. As a result of such KOH etching, the above-described four-sided pyramid-shaped cavity region 38 is formed in silicon 108.

Oxide layers 114 and 116 are then removed (e.g., by buffered hydrofluoric acid (BHF)). Optically reflective metal is then deposited on the sidewalls of cavity 38 (FIG. 55) on the wafer by sputtering or evaporation. The resulting structure is cut to the proper size and mounted on semiconductor device 28 to form the opto-electronic device 26 shown in FIGS. 3-4. As the above-described process is well understood by persons skilled in the art, details have been omitted for clarity.

Figure 56:
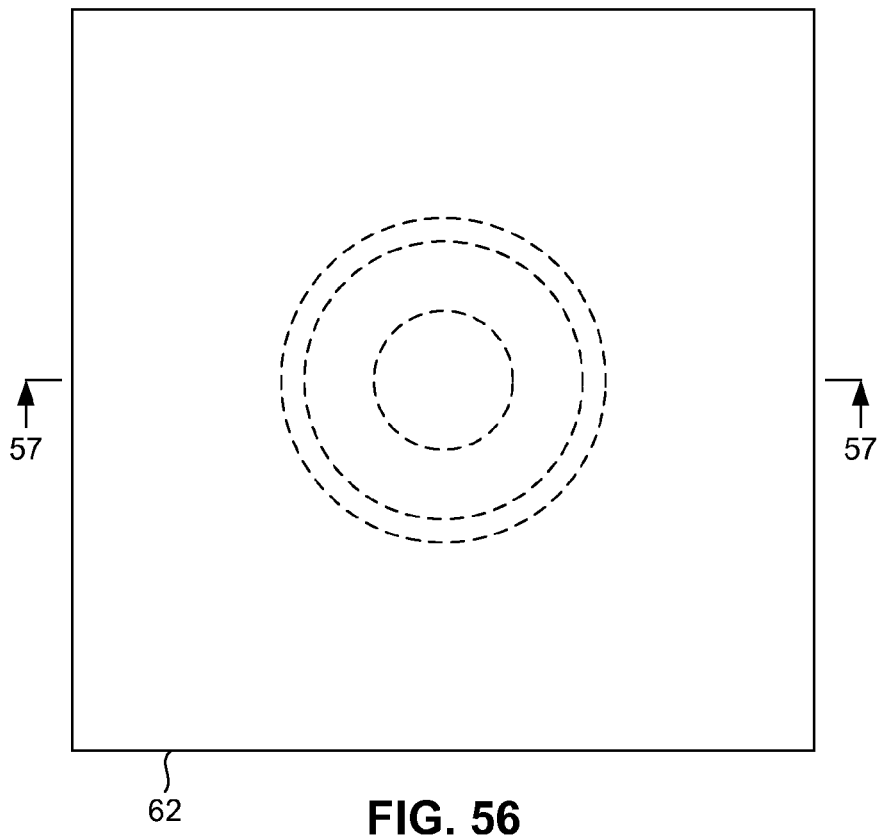
FIG. 56 is a top plan view illustrating an exemplary method for making the exemplary opto-electronic device of FIGS. 7-8.
Figure 57:
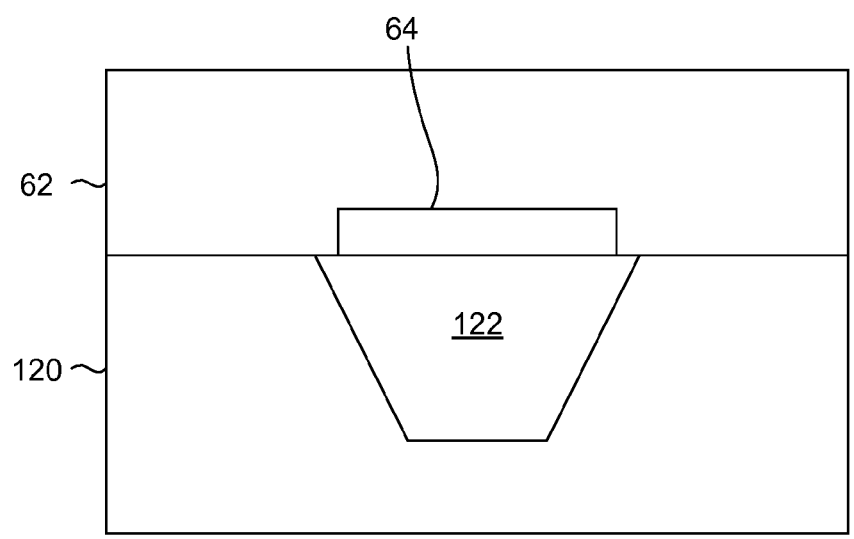
FIG. 57 is a sectional view taken along line 57-57 of FIG. 56.

An exemplary method for making opto-electronic device 56 (FIGS. 7-8) is illustrated in FIGS. 56-57. A mold 120 is provided. Mold 120 is transparent to ultraviolet light with the exception of the top surface of mold 120, which is opaque to ultraviolet light. Mold 120 has a mold cavity 122 with a shape corresponding to non-imaging optical concentrator 60. Mold cavity 122 is filled with a light-curable liquid (not shown), and semiconductor device 58 is lowered onto mold 120 such that the surface of semiconductor device 58 contacts the surface of the pool of liquid in mold cavity 122. Alternatively, mold 120 can be lowered onto semiconductor device 58, as capillary action inhibits the liquid from falling out of mold cavity 122. Mold 120 is irradiated with ultraviolet light to cure the liquid material within mold cavity 122, thereby forming non-imaging optical concentrator 60 (FIGS. 7-8) on the surface of semiconductor device 58. Mold 120 is then removed.

It should be understood that although making a single opto-electronic device is described above for purposes of clarity, many such opto-electronic devices can be formed simultaneously on the same wafer.

Figure 58:
FIG. 58 is a side elevation view illustrating a first step of an exemplary method for making an opto-electronic device using a mask having one or more microlenses.

Another exemplary method for making mask assemblies or mask structures similar to above-described mask assemblies 82 and 102 is illustrated in FIGS. 58-70. As illustrated in FIG. 58, a suitable optical mask substrate 202, consisting of a material such as fused silica, is first provided. Although in the exemplary embodiment optical mask substrate 202 consists of fused silica, in other embodiments such an optical mask substrate can consist of any other suitable material that is transparent to ultraviolet (UV) light (or other predetermined wavelengths used in the photolithographic processes described herein). Although optical mask substrate 202 is shown in FIG. 58 in generalized form for purposes of clarity, it should be understood that optical mask substrate 202 has a shape and size similar to that of a typical semiconductor wafer. For purposes of clarity, in FIGS. 58-71, only a small region of optical mask substrate 202 and associated structures are shown.

Figure 59:
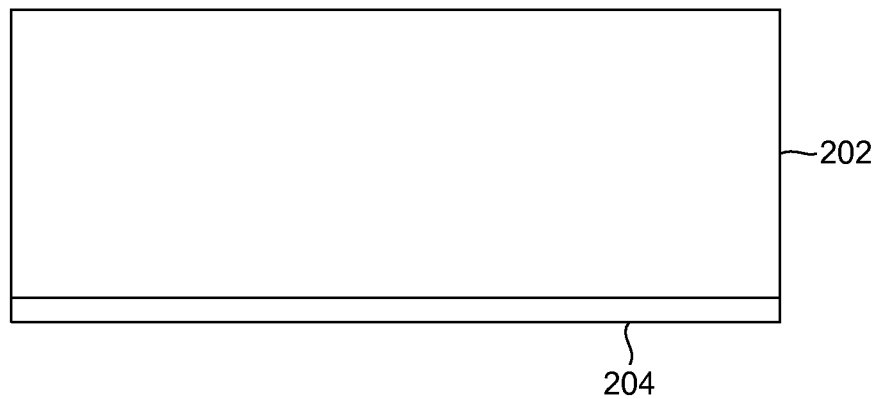
FIG. 59 is a side elevation view illustrating a second step of the exemplary method for making an opto-electronic device using a mask having one or more microlenses.

As illustrated in FIG. 59, a layer 204 of polysilicon is deposited on a surface of optical mask substrate 202. Although in the exemplary embodiment this first layer consists of polysilicon, in other embodiments such a first layer can consist of any other suitable material that can be deposited or otherwise formed into a thin (e.g., about 2000 angstroms) layer, is etchable by known etching processes, and is opaque to UV light (or other predetermined wavelengths used in the photolithographic processes described herein).

Figure 60:
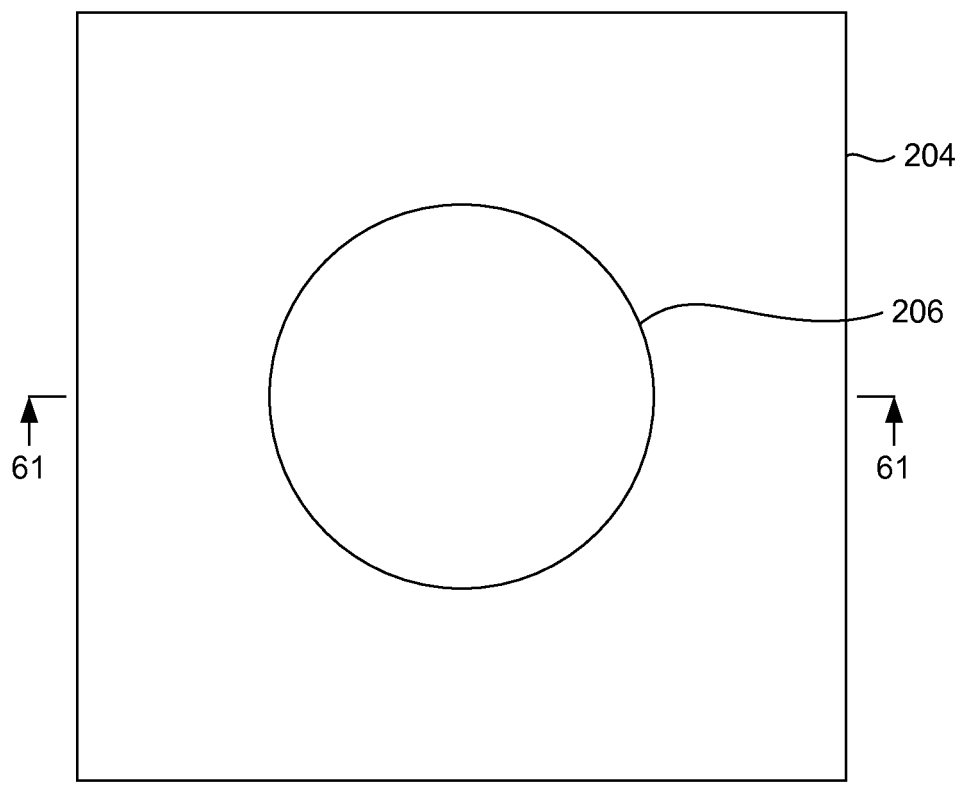
FIG. 60 is top plan view illustrating a third step of the exemplary method for making an opto-electronic device using a mask having one or more microlenses.
Figure 61:
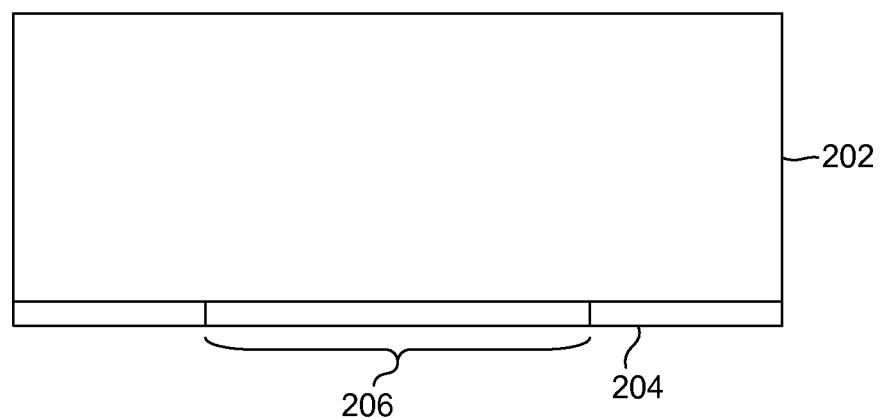
FIG. 61 is a sectional view taken along line 61-61 of FIG. 60.

As illustrated in FIGS. 60-61, a circular aperture 206 is then patterned into the layer 204 of polysilicon. Any suitable method can be used to pattern layer 204, such as depositing a photoresist material onto the surface of layer 204, exposing the photoresist layer to UV light through a mask (not shown), developing the photoresist layer to form a circular aperture, wet or dry etching layer 204 through the opening of the photoresist, and then stripping way the remaining photoresist. Such conventional sub-steps are not separately illustrated for purposes of clarity, as they are well understood by persons skilled in the art.

Figure 62:
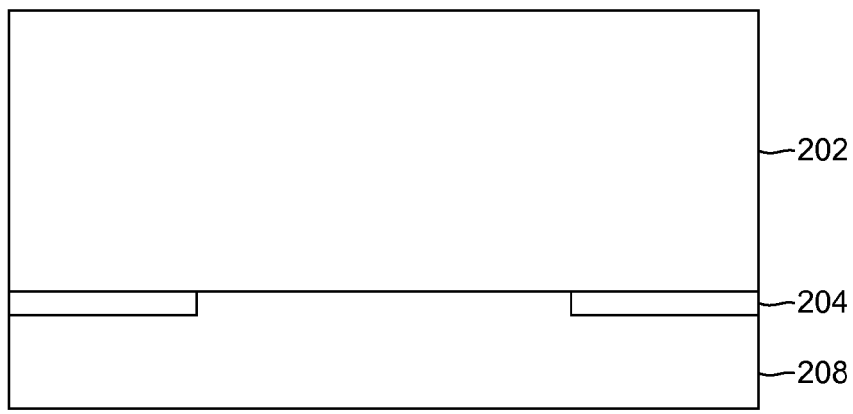
FIG. 62 is a side elevation view illustrating a third step of the exemplary method for making an opto-electronic device using a mask having one or more microlenses.

As illustrated in FIG. 62, a layer 208 of borophosphosilicate glass (BPSG) is then deposited onto the surface of layer 204. Although in the exemplary embodiment this second layer consists of BPSG, in other embodiments such a second layer can consist of any other optical material suitable for forming a refractive microlens of the type described below.

Figure 63:
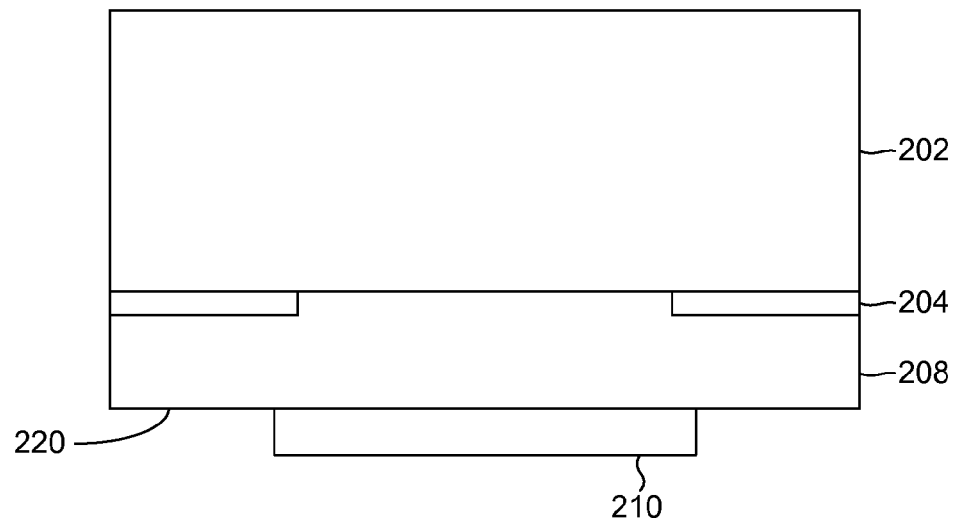
FIG. 63 is a side elevation view illustrating a fourth step of the exemplary method for making an opto-electronic device using a mask having one or more microlenses.

As illustrated in FIG. 63, a layer 210 of positive photoresist material is then deposited onto the surface of layer 208 and patterned into a disc-shaped region. Any suitable method can be used to pattern this third layer 210, such as exposing layer 210 to UV light through a mask (not shown) and then developing. Such conventional sub-steps are not separately illustrated for purposes of clarity, as they are well understood by persons skilled in the art.

Figure 64:
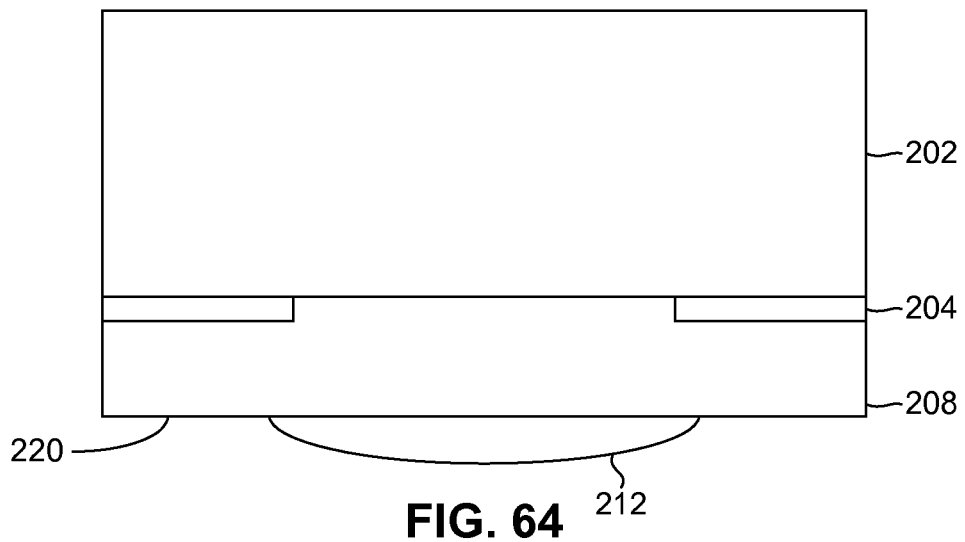
FIG. 64 is a side elevation view illustrating a fifth step of the exemplary method for making an opto-electronic device using a mask having one or more microlenses.

As illustrated in FIG. 64, following the above-described patterning, the layer 210 of positive photoresist material (FIG. 63) is exposed to sufficient heat to cause the disc-shaped region of positive photoresist to reflow into a lens-shaped region 212 and for its polymer to cross-link. As described below, cross-linking needs to occur to an extent sufficient to withstand the developing step described below with regard to FIGS. 66-67. Most commercially available positive photoresist materials sufficiently cross-link at about 250 C. Thus, in the exemplary embodiment layer 210 is exposed to a temperature of at least 250 C. As used herein, the term "lens-shaped" is intended to refer to a convex shape.

Figure 65:
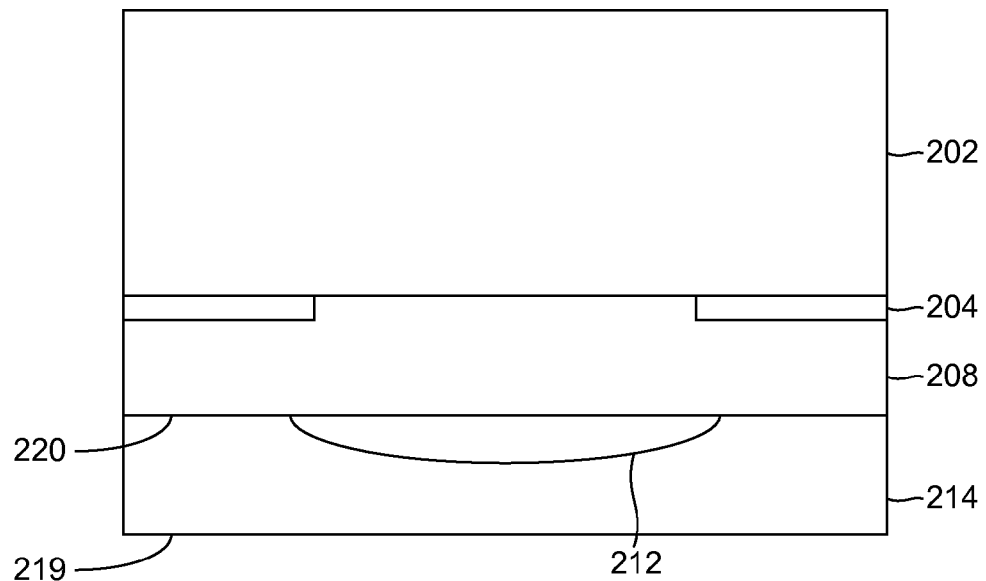
FIG. 65 is a side elevation view illustrating a sixth step of the exemplary method for making an opto-electronic device using a mask having one or more microlenses.
Figure 66:
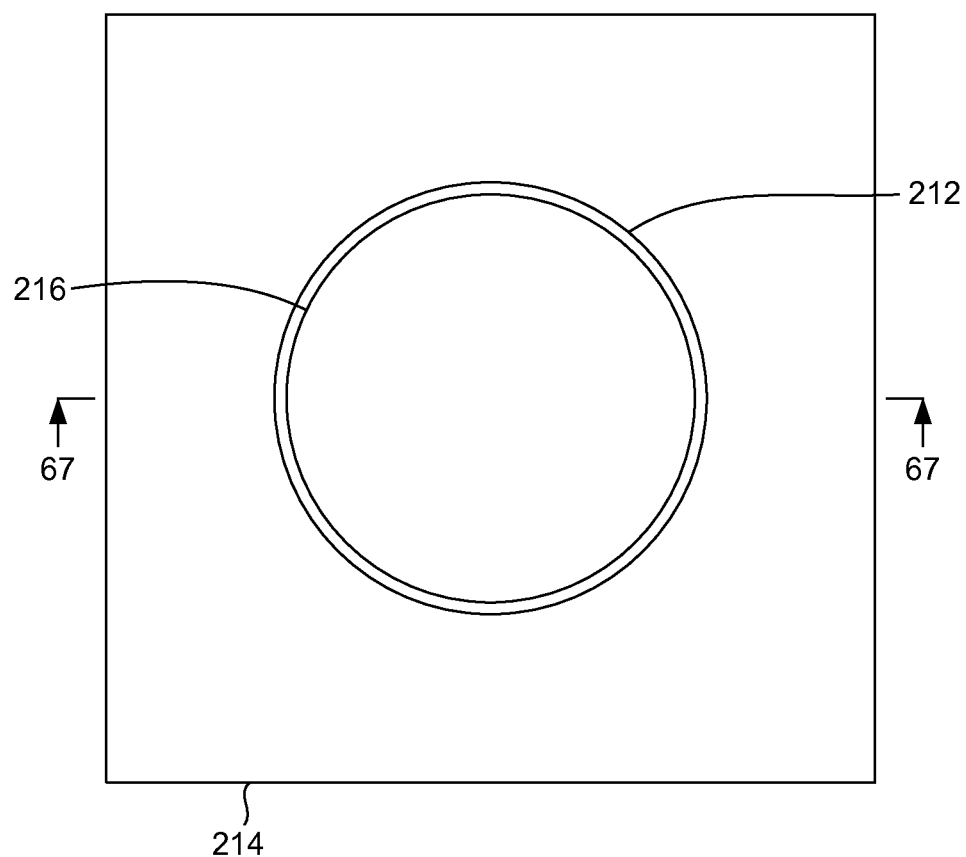
FIG. 66 is top plan view illustrating a seventh step of the exemplary method for making an opto-electronic device using a mask having one or more microlenses.
Figure 67:
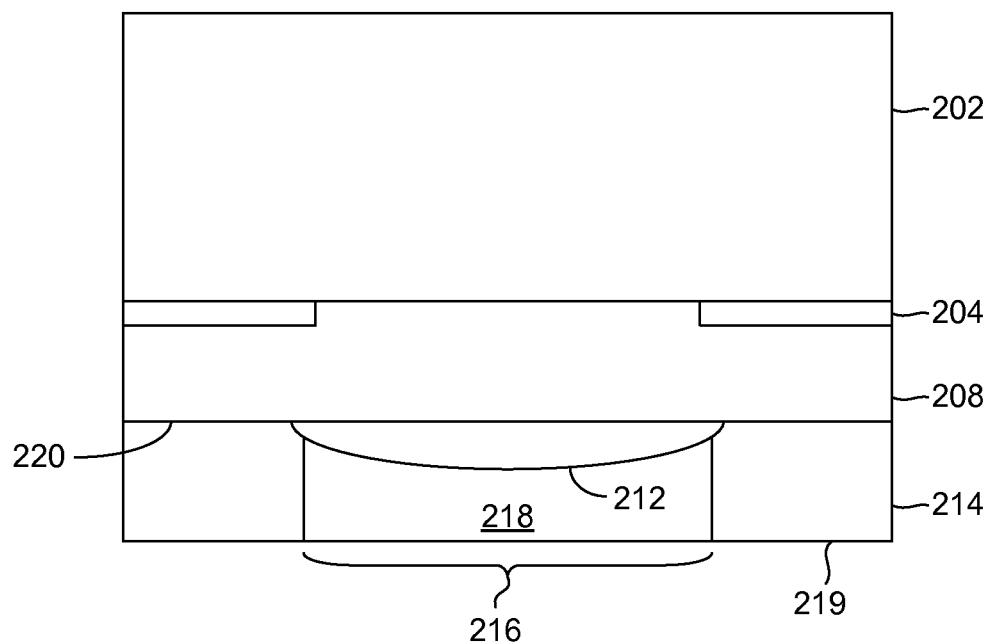
FIG. 67 is a sectional view taken along line 67-67 of FIG. 66.

As illustrated in FIG. 65, another layer 214 of positive photoresist material is deposited onto the surface of layer 208, thereby embedding lens-shaped region 212. As illustrated in FIGS. 66-67, a circular aperture 216 is then patterned into the surface 219 of layer 214. Any suitable method can be used to pattern this fourth layer 214, such as exposing it to UV light through a mask (not shown) and developing. Such conventional sub-steps are not separately illustrated for purposes of clarity, as they are well understood by persons skilled in the art. Patterning circular aperture 216 into layer 214 exposes the surface of lens-shaped region 212 of positive photoresist, as shown in FIG. 67. The developing process or similar process does not dissolve or otherwise damage lens-shaped region 212 of positive photoresist (from layer 210) because it has been cross-linked by the above-described heating step. Note that as circular aperture 216 has a depth dimension, circular aperture 216 defines a cavity 218 in which the surface of lens-shaped region 212 is exposed.

Figure 68:
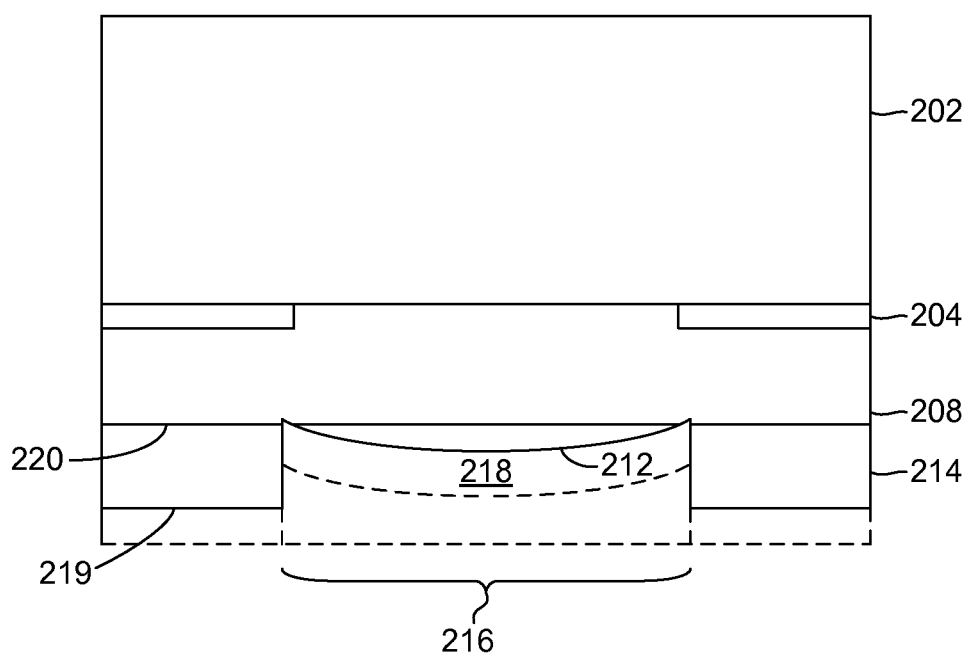
FIG. 68 is similar to FIG. 67, showing the structure after an eighth step of the exemplary method has begun.

As illustrated in FIG. 68, dry etching is performed. In the exemplary embodiment, the dry etching process comprises using an inductively coupled plasma (ICP) source. A suitable dry etching process is, for example, known in the art as ICP-RIE (reactive ion etching). When the dry etching process is begun, the process removes photoresist material from the horizontally exposed portions of lens-shaped region 212 and surface 219. There is substantially less etching on the sidewall of the cavity 218. When the dry etching process is begun, the end surface of cavity 218 initially includes the original surface of lens-shaped region 212 of positive photoresist. As the dry etching process progressively removes material on an atomic scale in an even distribution across the end surface of cavity 218, the shape of the end surface of cavity 218 remains unchanged throughout the etching process. That is, the shape of lens-shaped region 212 is preserved as etching continues downwardly into the layered structure, i.e., in a direction toward optical mask substrate 202, even as the etching process removes material from lens-shaped region 212. The original extent of material removed by dry etching is indicated in broken line in each of FIGS. 68-70. Thus, the original location of lens-shaped region 212, i.e., before dry etching is begun, is indicated in broken line in FIG. 68, while the location of lens-shaped region 212 at a time after etching has begun is indicated in solid line. Note that at the time represented by FIG. 68, lens-shaped region 212 is no longer located entirely within layer 214 but rather is located partially within layer 214 and partially within layer 208. That is, at the time represented by FIG. 68 lens-shaped region 212 has begun to be etched into layer 208. Similarly, surface 219 also get etched. The new surface 219 is closer to layer 208. In other words, layer 214 becomes thinner.

Figure 69:
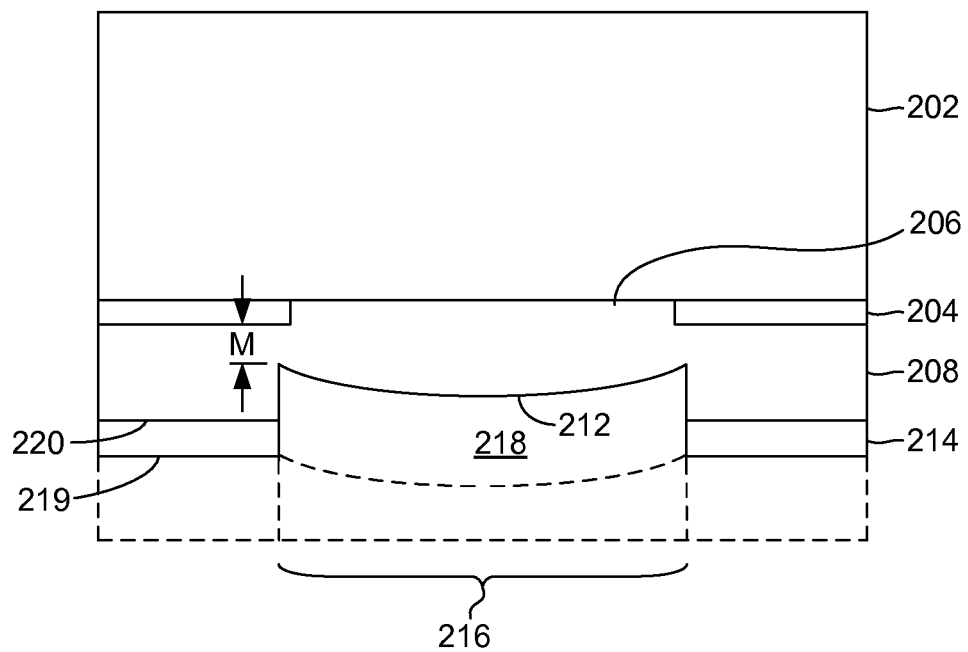
FIG. 69 is similar to FIG. 68, showing the structure after the eighth step has continued.

Note that the end surface of cavity 218 progresses downwardly into the layered structure from the initial location shown in FIG. 67 when dry etching is begun, reaching an exemplary intermediate location shown in FIG. 68 as dry etching continues, and ultimately reaching a final location shown in FIG. 69 when dry etching is completed. Note in FIG. 69 that the shape of the end surface of cavity 218, including the shape of lens-shaped region 212, has been transferred completely into the layer 208 of BPSG, even though all of the original material of lens-shaped region 212 (which as shown in FIG. 67 consists of the layer 214 of positive photoresist material) has been removed. That is, at the time represented by FIG. 69 when the dry etching process is complete, lens-shaped region 212 is located entirely within layer 208.

Note in FIG. 69 that when dry etching has been completed, the lens shape of the (removed) lens-shaped region 212 does not abut the layer 204 of polysilicon but rather is separated from it by a distance M. Providing such a separation or distance M may be useful to account for process variation across the wafer. Note that surface 219 does not cross into layer 208. Some material of layer 214 remains.

Figure 70:
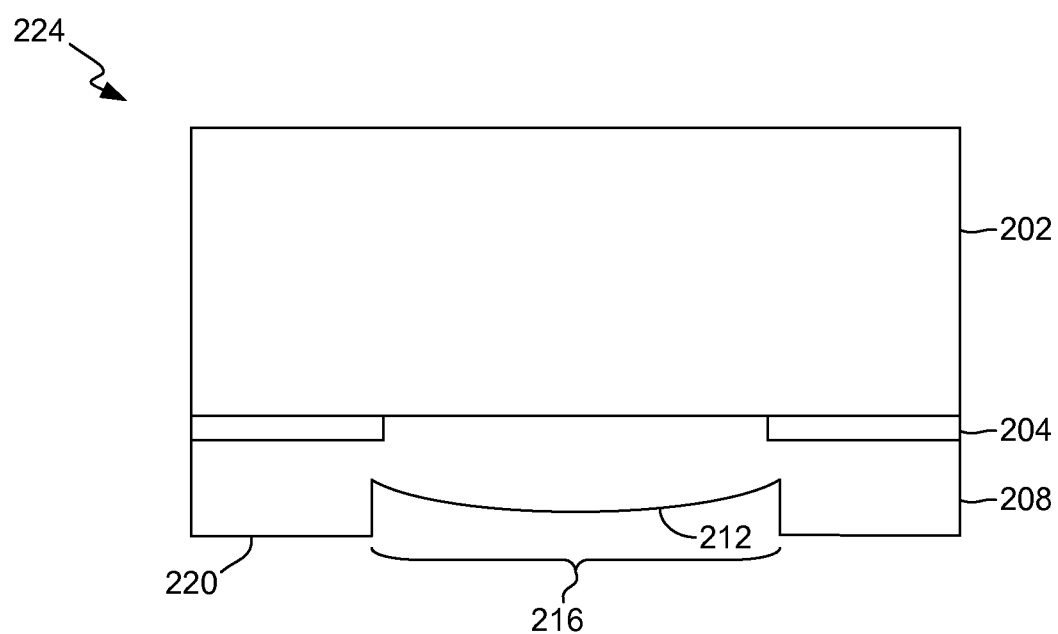
FIG. 70 is similar to FIG. 69, showing the structure after the eighth step has completed.

Also note in FIG. 70 that aperture 206 in layer 204 has a diameter less than the diameter of the lens-shaped region 212 of layer 208. As persons skilled in the art can appreciate, this overlapping of the perimeter of lens-shaped region 212 with the perimeter of aperture 206 provides beneficial optical characteristics over an arrangement (not shown) in which such a lens-shaped region and such an aperture have equal diameters.

As illustrated in FIG. 70, once dry etching is completed, the remaining portions of layer 214 of positive photoresist material can be removed. As a result of the processes described above, optical mask substrate 202 and layers 204 and 208 together define a masking structure 224.

Figure 71:
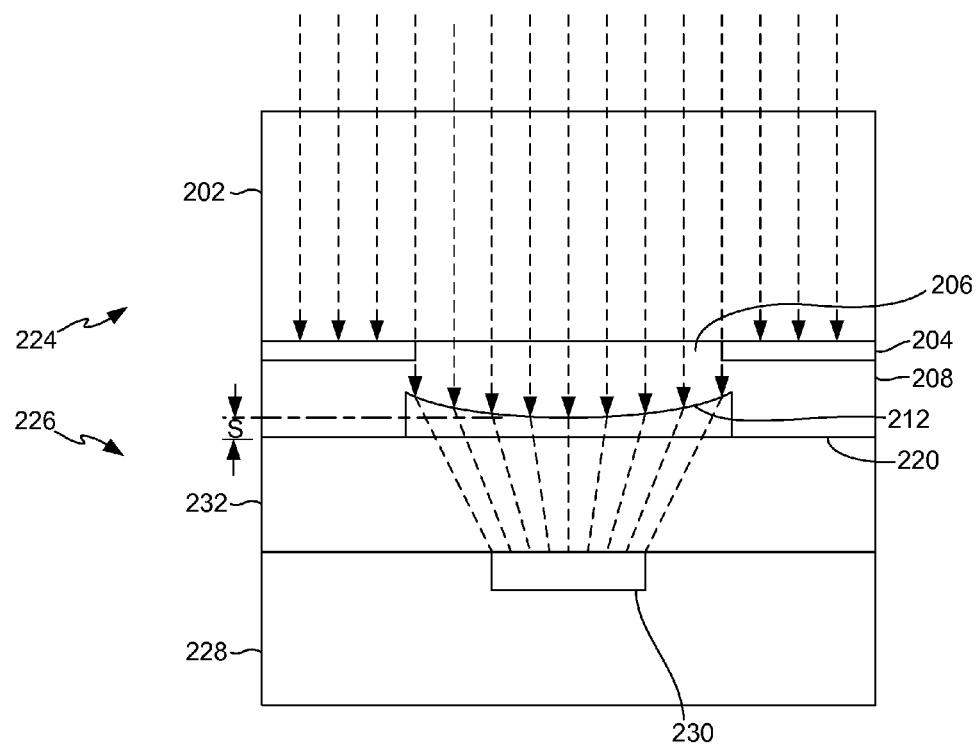
FIG. 71 is similar to FIG. 70, illustrating a ninth step for making an opto-electronic device using a mask having one or more microlenses.

As illustrated in FIG. 71, masking structure 224 can be used in further photolithographic processing to expose a semiconductor structure 226. Such further photolithographic processing can be similar to that described above with regard to FIGS. 27 and 48. Thus, for example, semiconductor structure 226 can comprise a semiconductor wafer 228 on which are fabricated, for example, a multiplicity of PIN photodiodes, each having an active area 230. Semiconductor structure 226 includes a layer of negative photoresist 232 covering the surface of semiconductor wafer 228 in which active area 230 is formed.

In a manner similar to that described above with regard to FIG. 48, masking structure 224 is placed on top of semiconductor structure 226 and illuminated from the top, as indicated by the broken-line arrows in FIG. 71. Layer 208 of masking structure 224 serves as a standoff to ensure proper spacing between lens-shaped region 212 and resist surface 220. Note that the light is transmitted through optical mask substrate 202, aperture 206 in layer 204, and lens-shaped region 212 of layer 208. Lens-shaped region 212 serves as a microlens that bends the light by refraction into a cone shape. Thus, a cone-shaped region within negative photoresist 232 is illuminated. Subsequent developing removes the portion of negative photoresist 232 that was not illuminated and leaves intact the portion of negative photoresist 232 that was illuminated. The resulting structure is similar to that described above with regard to FIG. 49. Also, it should be understood that although in the exemplary embodiment circular aperture 216 has a circular shape, in other embodiments (not shown) such an aperture can have any other suitable shape; since layer 208 serves as a standoff, the important characteristic is not the aperture shape but rather the distance or separation (S) between surface 220 and the apex of lens-shaped region 212.

Figure 72:
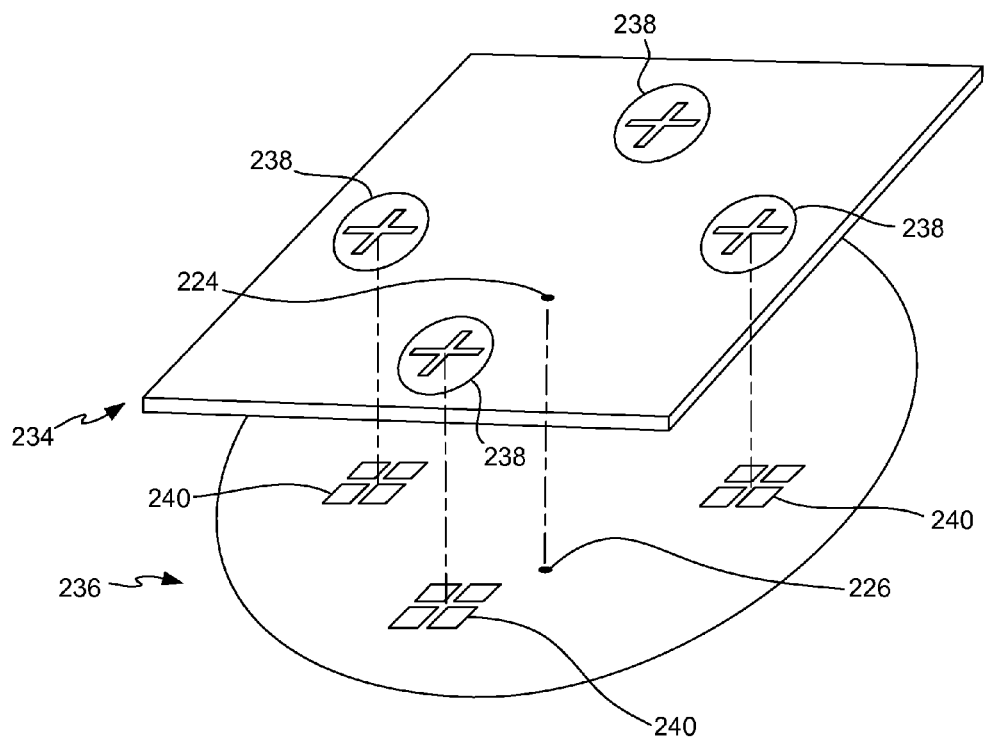
FIG. 72 is a generalized perspective view illustrating a method for aligning the mask with a semiconductor wafer.

Masking structure 224 can be an exemplary one of many hundreds or thousands of similar masking structures co-formed in the manner described above using photolithographic techniques. As illustrated in FIG. 72, the totality of such masking structures defines a mask 234. Similarly, semiconductor structure 226 can be one of many hundreds or thousands of similar semiconductor structures co-formed in the manner described above using photolithographic techniques. The totality of such semiconductor structures defines a semiconductor wafer 236.

As illustrated in FIG. 72, before the exposure and development processes described above with regard to FIG. 71 are performed, mask 234 can be trimmed into a rectangular shape to facilitate its use in standard semiconductor equipment known as a mask aligner (not shown). For example, in an instance in which mask 234 begins as a glass wafer 150 mm in diameter, it can be cut into a square shape that is 100 mm on each side. Mask 234 then has the same mechanical shape as a standard 100 mm glass mask for aligners that can accept 75 mm diameter wafers and below. Note that semiconductor wafer 236 typically is disc shaped.

Figure 73:
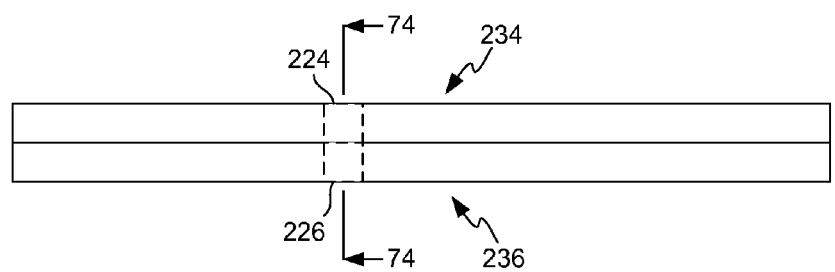
FIG. 73 is a side elevation view of the mask aligned with the semiconductor wafer of FIG. 72.

Mask 234 includes two or more (e.g., as many as thousands, tens of thousands, etc.) alignment indicators 238 of the type commonly referred to in art as alignment marks. For example, as shown in FIG. 72, each alignment indicator 238 can comprise a cross within a circle. Alignment indicators 238 can be formed in, for example, layer 204. Similarly, semiconductor wafer 236 includes several other alignment features or alignment indicators 240. For example, as shown in FIG. 72, each alignment indicator 240 can comprise four squares arranged in a square formation. Alignment indicators 240 can be formed on the surface of semiconductor wafer 228. Manufacturing personnel can view alignment indicators 238 and 240 through a microscope (not shown) and attempt to adjust the position of one or both of mask 234 and semiconductor wafer 236 until each alignment indicator 238 on mask 234 is aligned with a corresponding alignment indicator 240 on semiconductor wafer 236. Note in the cross-sectional view of FIG. 73 that when mask 234 and semiconductor wafer 236 are aligned with each other and adjacent to each other, masking structure 224 is aligned with semiconductor structure 226 in preparation for the exposure and development processes described above with regard to FIG. 71.

Figure 74:
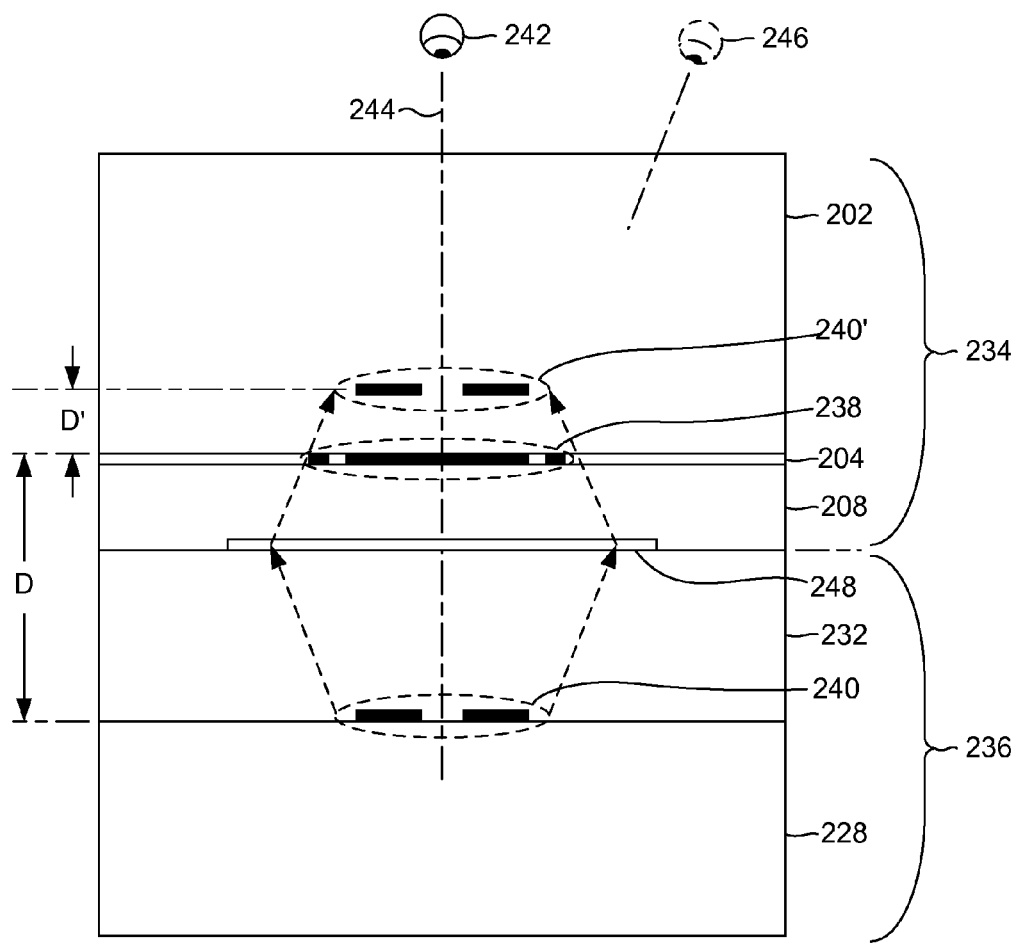
FIG. 74 is a sectional view taken along line 74-74 of FIG. 73.

A parallax effect can occur that can hamper efforts to align mask 234 and semiconductor wafer 236 while viewing alignment indicators 238 and 240 through a microscope. As illustrated in FIG. 74 (not to scale), this parallax effect is caused by the combined thickness of layers 208 and 232. An observer 242 looking along an axis 244 intersecting both alignment indicator 238 and alignment indicator 240 correctly perceives alignment indicators 238 and 240 as aligned with each other and therefore does not (further) adjust the positions of mask 234 or semiconductor wafer 236. However, due to the parallax effect caused by the separation or distance D between alignment indicators 238 and 240, an observer 246 looking from a position not on axis 244 would (absent the feature described below) erroneously perceive alignment indicators 238 and 240 as not aligned with each other and may therefore reposition one or both of mask 234 and semiconductor wafer 236 in an attempt to improve alignment. Such an attempt would result in the mask and wafer being in a misaligned state.

As illustrated in FIG. 74, an alignment lens 248 can be provided in a location aligned along axis 244 with alignment indicators 238 and 240. An exemplary method for forming alignment lens 248 is described below. Alignment lens 248 can be either a refractive lens or a diffractive lens constructed as a phase grating. Alignment lens 248 promotes minimization of the above-described parallax effect by reducing the distance D between alignment indicators 238 and 240 to an effective or apparent distance D'. Alignment lens 248 reduces distance D to an apparent distance D' by projecting an image 240' of alignment indicator 240 into optical mask substrate 202. Efforts to align mask 234 and semiconductor wafer 236 while observing alignment indicator 238 and alignment indicator 240 (seen by observer 242 as image 240') through a microscope can be more effective because an off-axis observer perceives alignment indicator 238 and image 240' as more closely aligned with each other than such an observer would perceive alignment indicators 238 and 240.

Figure 75:
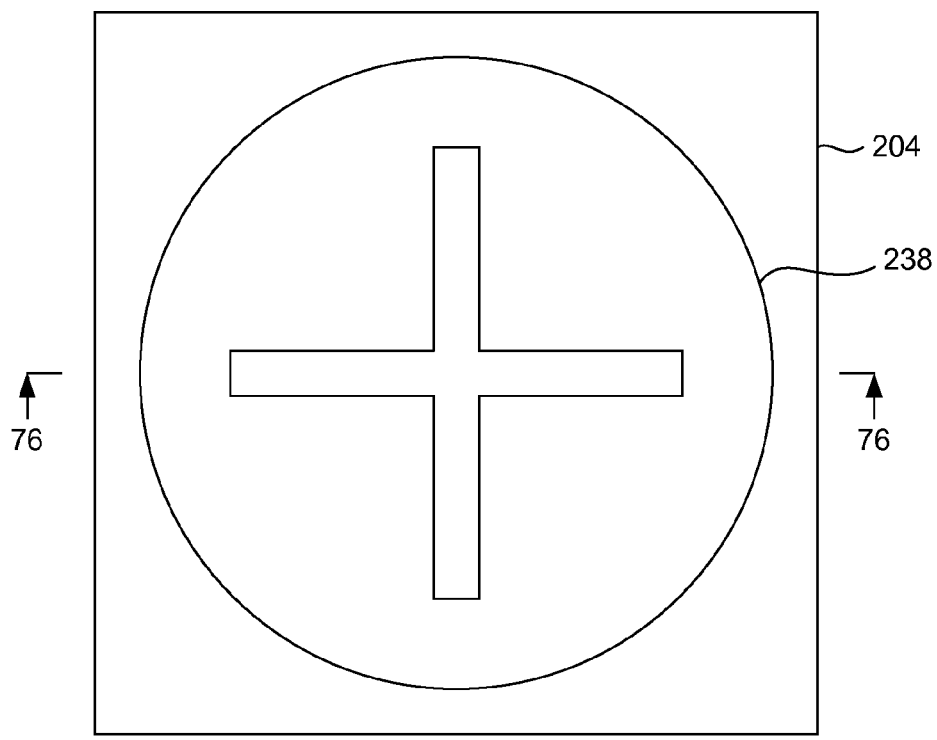
FIG. 75 is a top plan view illustrating a step of an exemplary method for forming alignment indicators in a mask.
Figure 76:
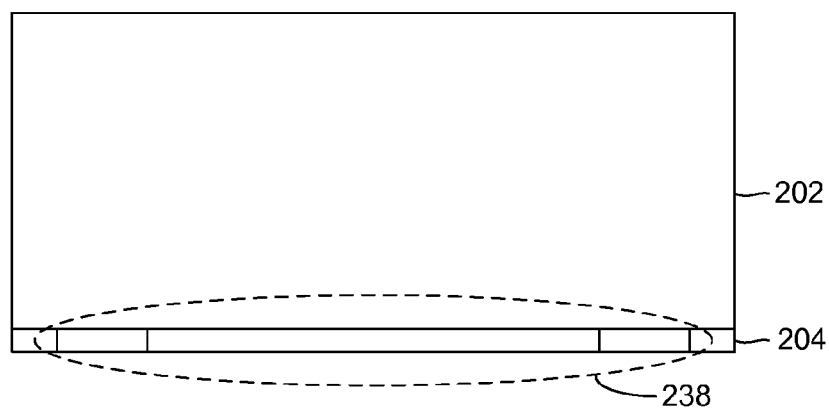
FIG. 76 is a sectional view taken along line 76-76 of FIG. 75.
Figure 77:
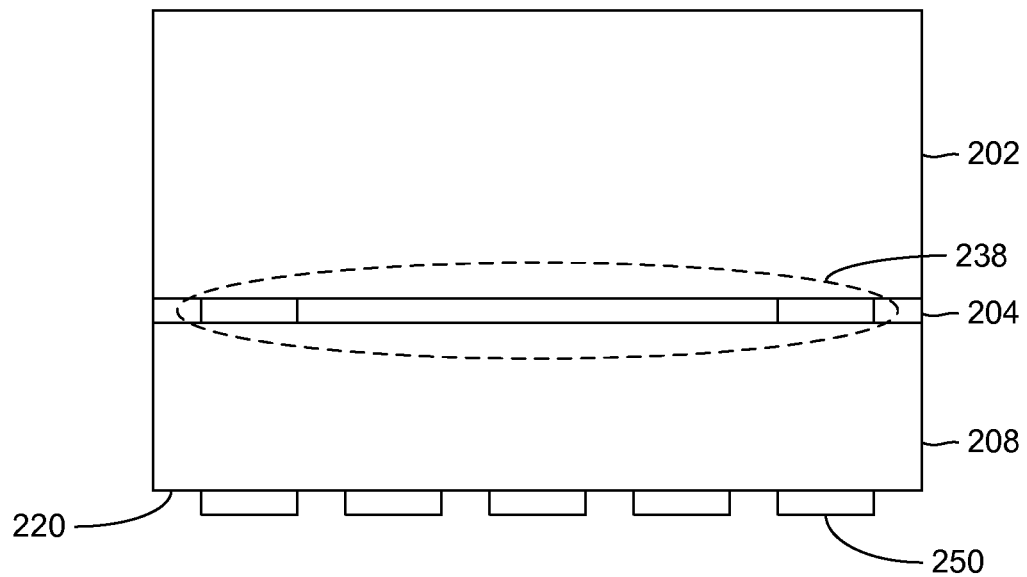
FIG. 77 is a side elevation view illustrating a step of an exemplary method for forming a phase grating in a mask.
Figure 78:
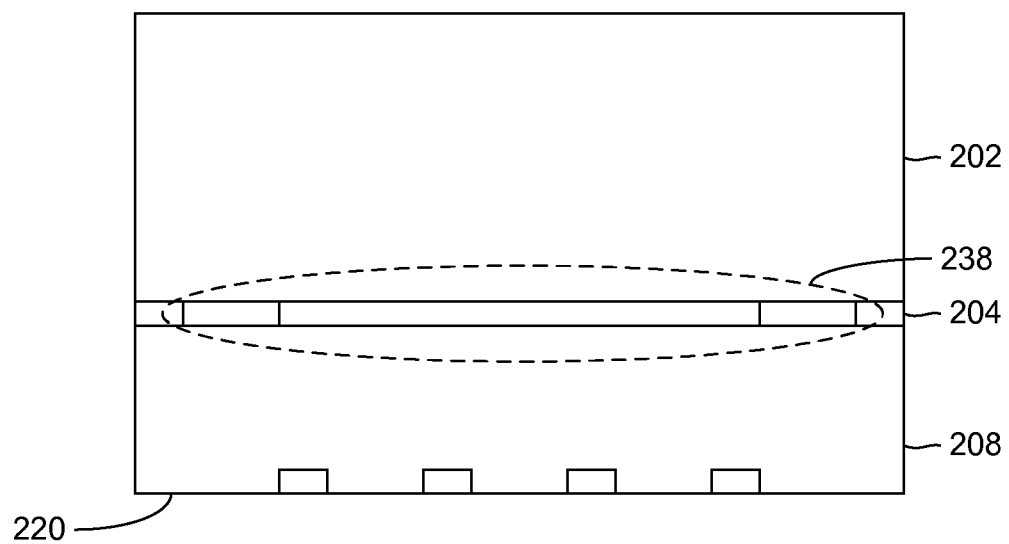
FIG. 78 is similar to FIG. 77, illustrating another step of the exemplary method.

To form alignment indicators 238 on mask 234, the step described above with regard to FIG. 60 can be modified as illustrated in FIGS. 75-76, such that alignment indicators 238 are patterned into layer 204 of polysilicon when circular aperture 206 (FIG. 60) is patterned into layer 204. As illustrated in FIG. 77, alignment indicators 238 then become embedded in layer 208 of BPSG, which is deposited on layer 204 as described above with regard to FIG. 62.

Figure 79:
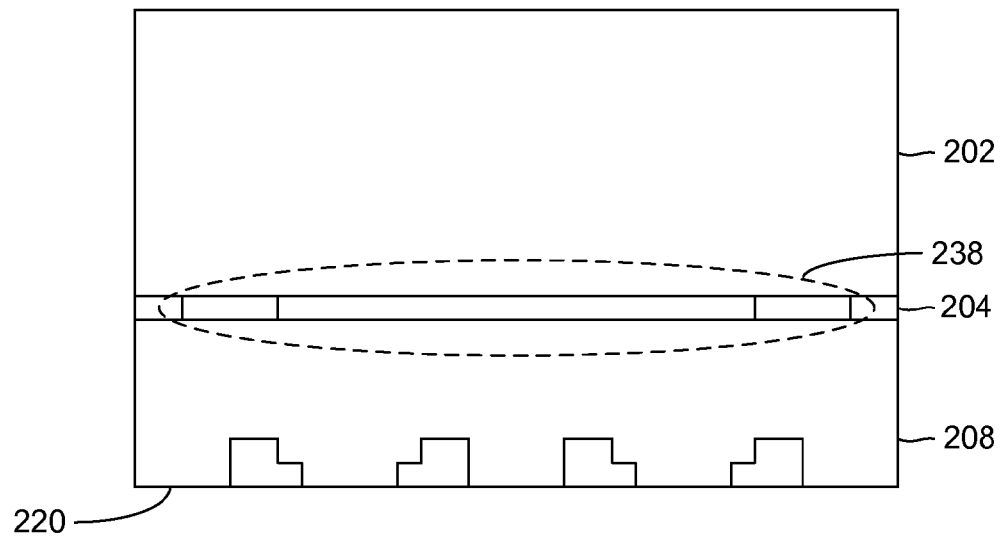
FIG. 79 is similar to FIGS. 77-78, illustrating formation of phase grating as a result of repeatedly performing the illustrated steps.

To form alignment lens 248 on mask 234, the step described above with regard to FIG. 63 can be modified as illustrated in FIG. 77, such that a pattern of photoresist 250 is applied when layer 210 (FIG. 63) of photoresist is applied. The pattern of photoresist 250 is used as a mask to etch layer 208. The pattern of photoresist 250 is then removed. As illustrated in FIG. 79, these steps of applying a pattern of photoresist 250 and using it as a mask to etch layer 208 are performed repeatedly until a phase grating has been formed in layer 208. Persons skilled in the art are capable of selecting suitable patterns of photoresist 250 that result in formation of a suitable phase grating.

Although in the exemplary embodiment described above alignment lens 248 is diffractive, in other embodiments such an alignment lens can be refractive. Such a refractive alignment lens can be formed in the manner described above with regard to FIGS. 60-70. In embodiments having a refractive alignment lens, the diameter of the disc-shaped region of photoresist (similar to layer 210 in FIG. 63) should be adjusted to provide the proper curvature, which may differ from the curvature of above-described lens-shaped region 212 (FIG. 64).

One or more illustrative embodiments of the invention have been described above. However, it is to be understood that the invention is defined by the appended claims and is not limited to the specific embodiments described.

What is claimed is:

1. A semiconductor assembly, comprising:
    an optical mask for use in fabricating a semiconductor device, the optical mask having an optical mask substrate comprising a first alignment indicator;
    a wafer comprising a second alignment indicator; and
    a refractive alignment lens etched into a glass layer, the glass layer having a first surface that is in contact with the optical mask substrate and an opposing surface that is in contact with the wafer to facilitate a visual alignment of the first alignment indicator with the second alignment indicator, wherein the refractive alignment lens is etched at a location on the glass layer that is aligned with a viewing axis extending between the first alignment indicator and the second alignment indicator, the location selected to configure the alignment lens to project an image of the second alignment indicator into the optical mask substrate and provide an effective distance that is smaller than an actual distance between the first alignment indicator and the second alignment indicator for overcoming a parallax effect when the second alignment indicator is viewed along the viewing axis during the visual alignment.

2. A method, comprising:
    providing an optical mask substrate, the optical mask substrate transparent to a predetermined wavelength of light;
    depositing a first layer on a surface of the optical mask substrate, the first layer consisting of a material opaque to the predetermined wavelength;
    forming an aperture in the first layer;
    depositing a second layer on a surface of the first layer, the second layer consisting of a material transparent to the predetermined wavelength;
    depositing a third layer on a surface of the second layer, the third layer consisting of photoresist material;
    patterning the third layer to produce a disc-shaped region;
    heating the third layer until the disc-shaped region reflows into a lens-shaped region and cross-links;
    depositing a fourth layer on a surface of the third layer, the fourth layer embedding the disc-shaped region, the fourth layer consisting of photoresist material;
    patterning the fourth layer to produce a cavity extending to a surface of the lens-shaped region, an end of the cavity including the surface of the lens-shaped region; and
    dry etching the end of the cavity until the second layer develops a shape corresponding to the lens-shaped region, whereby the optical mask substrate and the first and second layers together define a optical mask device.

3. The method of claim 2, wherein the optical mask substrate consists of fused silica.

4. The method of claim 2, wherein the first layer consists of polysilicon.

5. The method of claim 2, wherein the second layer consists of borophosphosilicate glass (BPSG).

6. The method of claim 2, wherein the third layer consists of a positive photoresist polymer.

7. The method of claim 2, wherein heating the third comprises heating the third layer to at least 250 C.

8. The method of claim 2, wherein the fourth layer consists of a positive photoresist polymer.

9. The method of claim 2, wherein dry etching the end of the cavity comprises reactive ion etching (RIE).

10. The method of claim 9, wherein reactive ion etching comprises inductively coupled plasma (ICP) RIE.

11. The method of claim 2, wherein the cavity has a diameter at least equal to a diameter of the aperture.

12. The method of claim 2, wherein the aperture has a diameter less than a diameter of the lens-shaped region.

13. The method of claim 2, further comprising:
    providing a semiconductor wafer comprising a semiconductor device;
    depositing a layer of photoresist material over the semiconductor device; and
    aligning the optical mask device with the semiconductor wafer;
    directing light through the optical mask device onto the photoresist material on the semiconductor wafer; and
    developing the photoresist material on the semiconductor wafer.

14. The method of claim 13, wherein aligning the optical mask device with the semiconductor wafer comprises:
    providing a layer defining an alignment lens between the optical mask device and the semiconductor wafer, wherein the alignment lens is one of refractive and diffractive; and
    aligning a mask alignment indicator on the optical mask device with an image of a wafer alignment indicator on the semiconductor wafer, the image of the wafer alignment indicator projected into the optical mask device by the alignment lens.

15. The method of claim 14, wherein the layer defining the lens comprises a Fresnel pattern.

16. A method, comprising:
    providing an optical mask substrate, the optical mask substrate transparent to a predetermined wavelength of light;
    depositing a first layer on a surface of the optical mask substrate, the first layer consisting of a material opaque to the predetermined wavelength;
    forming an aperture in the first layer;
    depositing a second layer on a surface of the first layer, the second layer consisting of a material transparent to the predetermined wavelength;
    depositing a third layer on a surface of the second layer, the third layer consisting of photoresist material;
    patterning the third layer to produce a disc-shaped region;
    heating the third layer until the disc-shaped region reflows into a lens-shaped region and cross-links;
    depositing a fourth layer on a surface of the third layer, the fourth layer embedding the disc-shaped region, the fourth layer consisting of photoresist material;
    patterning the fourth layer to produce a cavity extending to a surface of the lens-shaped region, an end of the cavity including the surface of the lens-shaped region; and reactive ion etching (RIE) the end of the cavity until the second layer develops a shape corresponding to the lens-shaped region, whereby the optical mask substrate and the first and second layers together define an optical mask device;
    providing a semiconductor wafer comprising a semiconductor device;
    depositing a layer of photoresist material over the semiconductor device;

providing a layer defining an alignment lens between the optical mask device and the semiconductor wafer, wherein the alignment lens is one of refractive and diffractive; and aligning an optical mask device alignment indicator on the optical mask device with an image of a wafer alignment indicator on the semiconductor wafer, the image of the wafer alignment indicator projected into the optical mask device by the alignment lens;

directing light through the mask onto the photoresist material on the semiconductor wafer; and developing the photoresist material on the semiconductor wafer.

17. The method of claim 16, wherein the optical mask substrate consists of fused silica.

18. The method of claim 16, wherein the first layer consists of polysilicon.

19. The method of claim 16, wherein the second layer consists of borophosphosilicate glass (BPSG).

20. The method of claim 16, wherein the third layer consists of a positive photoresist polymer.

21. The method of claim 16, wherein heating the third comprises heating the third layer to at least 250 C.

22. The method of claim 16, wherein the fourth layer consists of a positive photoresist polymer.

* * * * *